US010003039B2

(12) United States Patent
Jang et al.

(10) Patent No.: US 10,003,039 B2
(45) Date of Patent: Jun. 19, 2018

(54) LIGHT EMITTING DEVICE AND METHOD OF FABRICATING THE SAME

(71) Applicant: Seoul Viosys Co., Ltd., Ansan-si (KR)

(72) Inventors: Jong Min Jang, Ansan-si (KR); Jong Hyeon Chae, Ansan-si (KR); Dae Woong Suh, Ansan-si (DE)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days. days.

(21) Appl. No.: 15/513,150

(22) PCT Filed: Sep. 1, 2015

(86) PCT No.: PCT/KR2015/009172
§ 371 (c)(1),
(2) Date: Mar. 21, 2017

(87) PCT Pub. No.: WO2016/047932
PCT Pub. Date: Mar. 31, 2016

(65) Prior Publication Data
US 2017/0309853 A1    Oct. 26, 2017

(30) Foreign Application Priority Data

Sep. 26, 2014  (KR) .......................... 10-2014-0129008

(51) Int. Cl.
*H01L 51/50*   (2006.01)
*H01L 51/44*   (2006.01)
(Continued)

(52) U.S. Cl.
CPC ............ *H01L 51/504* (2013.01); *H01L 33/46* (2013.01); *H01L 51/442* (2013.01); *H01L 33/0079* (2013.01); *H01L 33/44* (2013.01)

(58) Field of Classification Search
CPC ....... H01L 2933/0033; H01L 2933/005; H01L 2933/0066–2933/0091;
(Continued)

(56) References Cited

U.S. PATENT DOCUMENTS 8,110,421 B2   2/2012 Sugizaki et al.
8,773,006 B2   7/2014 Kim et al.
(Continued)

FOREIGN PATENT DOCUMENTS

JP   2005-268431   9/2005
JP   2010-141176   6/2010
(Continued)

OTHER PUBLICATIONS

International Search Report dated Dec. 14, 2015, in International Application No. PCT/KR2015/009172.
(Continued)

*Primary Examiner* — Julia Slutsker
(74) *Attorney, Agent, or Firm* — H.C. Park & Associates, PLC

(57) ABSTRACT

A light emitting device and method of fabricating the same using a wafer level package process are disclosed. The light emitting device has improved heat dissipation to prevent damage by heat, thereby achieving improvement in reliability and luminous efficacy. In addition, the light emitting device has a small difference in coefficients of thermal expansion and thus can reduce stress applied to a light emitting structure to prevent damage to the light emitting structure, thereby achieving improvement in reliability and luminous efficacy.

18 Claims, 16 Drawing Sheets

(51) Int. Cl.
    *H01L 33/46*     (2010.01)
    *H01L 33/00*     (2010.01)
    *H01L 33/44*     (2010.01)

(58) Field of Classification Search
    CPC ...... H01L 33/48–33/648; H01L 51/504; H01L 51/442; H01L 33/46; H01L 33/44; H01L 33/007
    See application file for complete search history.

(56) References Cited

U.S. PATENT DOCUMENTS

| | | |
|---|---|---|
| 8,916,898 B2 | 12/2014 | Suh et al. |
| 9,099,631 B2 | 8/2015 | Yang et al. |
| 2014/0203314 A1* | 7/2014 | Kojima ................ H01L 33/504 257/98 |

FOREIGN PATENT DOCUMENTS

| | | |
|---|---|---|
| KR | 10-2012-0005385 | 1/2012 |
| KR | 10-2012-0087505 | 8/2012 |
| KR | 10-2013-0022053 | 3/2013 |

OTHER PUBLICATIONS

Written Opinion dated Dec. 14, 2015, in International Application No. PCT/KR2015/009172.

* cited by examiner

LIGHT EMITTING DEVICE AND METHOD OF FABRICATING THE SAME

CROSS-REFERENCE TO RELATED APPLICATIONS

This application is the National Stage Entry of International Patent Application No. PCT/KR2015/009172, filed on Sep. 1, 2015, and claims priority from and the benefit of Korean Patent Application No. 10-2014-0129008, filed on Sep. 26, 2014, each of which are incorporated by reference for all purposes as if fully set forth herein.

BACKGROUND

Field

The present invention relates to a light emitting device and a method of fabricating the same, and more particularly, to a method of fabricating a light emitting device in which a metal bulk is formed on an electrode, and a light emitting device fabricated by the same.

Discussion of the Background

A light emitting diode (LED) is a solid state device capable of converting electric energy into light, and generally includes an active layer of at least one semiconductor material interposed between semiconductor layers doped with opposite conductive type impurities. When bias is applied across these doped layers, electrons and holes are injected into the active layer and recombine with each other to generate light.

Typically, a light emitting diode is used as a light emitting diode module. The light emitting diode module is generally fabricated by fabricating a light emitting diode chip having electrodes at a wafer level, followed by a packaging process and a module process. Recently, technology for fabricating a light emitting diode package at the wafer level is developed so as to eliminate a separate packaging process. As a result, this technology simplifies a fabrication process, thereby reducing process time and fabrication costs.

The light emitting diode generates large amounts of heat during light emission. This causes a decrease in the recombination rate of holes and electrons in the light emitting diode, thereby deteriorating internal quantum efficiency of the light emitting diode and reducing luminous efficacy. In order to solve this problem, the light emitting diode employs a heat dissipation pad, but still suffers from damage caused by thermal stress applied to the light emitting diode upon light emission. On the other hand, due to restriction of a growth substrate for growing semiconductor layers, technology for separating the growth substrate from the semiconductor layers has been developed. However, separation of the growth substrate from the semiconductor layers provides a problem of easy damage to a thin semiconductor layer.

Therefore, there is a need for technology capable of preventing semiconductor layers from suffering from severe stress due to heat generated during the operation of a light emitting diode and preventing damage to semiconductor layers upon separation of a growth substrate from the semiconductor layers.

SUMMARY

Exemplary embodiments of the invention provide a light emitting device capable of effectively dissipating heat while relieving stress applied to a semiconductor layer.

Exemplary embodiments of the invention provide a light emitting device that can be fabricated using a wafer level package process.

Exemplary embodiments of the invention provide a light emitting device that can prevent damage to the light emitting device by heat, thereby securing improvement in reliability and luminous efficacy.

Exemplary embodiments of the invention provide a light emitting device that can reduce stress applied to a light emitting structure to prevent damage to the light emitting structure, thereby securing improvement in reliability and luminous efficacy.

Exemplary embodiments of the invention provide a method of fabricating a light emitting device that has a metal bulk using a wafer level package process.

Exemplary embodiments of the invention provide a method of fabricating a light emitting device that can prevent damage to a light emitting structure upon removal of a growth substrate from the light emitting structure, thereby securing improvement in reliability and luminous efficacy.

In accordance with one exemplary embodiment of the invention, a light emitting device includes: a light emitting structure including a first conductive type semiconductor layer, a second conductive type semiconductor layer disposed on the first conductive type semiconductor layer, and an active layer disposed between the first conductive type semiconductor layer and the second conductive type semiconductor layer; a first electrode electrically connected to the first conductive type semiconductor layer; a second electrode disposed on the second conductive type semiconductor layer and electrically connected to the second conductive type semiconductor layer; a lower insulation layer covering an upper surface of the light emitting structure and upper and side surfaces of the second electrode, the lower insulation layer being disposed between the light emitting structure and the first electrode and insulating the first electrode from the second electrode; an upper insulation layer covering a portion of the first electrode; a first metal bulk and a second metal bulk separated from each other on the upper insulation layer and electrically connected to the first electrode and the second electrode, respectively; and an insulation portion disposed between the first metal bulk and the second metal bulk, wherein a difference in coefficients of thermal expansion represented by the following Equation 1 may be 20% or less.

A Difference in coefficients of thermal expansion=[(a coefficient of thermal expansion of the first metal bulk or a coefficient of thermal expansion of the second metal bulk−a coefficient of thermal expansion of the light emitting structure)/ the coefficient of thermal expansion of the first metal bulk or the second metal bulk]×100.  [Equation 1]

With this structure, the light emitting device exhibits improved heat dissipation and thus can be prevented from being damaged by heat, thereby providing improvement in reliability and luminous efficacy of the light emitting device. Further, since the light emitting device has a small difference in coefficient of thermal expansion, stress applied to the light emitting structure is reduced to prevent damage to the light emitting structure, thereby improving reliability and luminous efficiency of the light emitting device.

The first metal bulk and the second metal bulk may include Cu/Mo or Cu/W. Since Cu/Mo or Cu/W has similar coefficients of thermal expansion to that of the light emitting structure, stress applied to the light emitting structure is low upon generation of heat from the light emitting structure to prevent damage to the light emitting structure, thereby improving reliability and luminous efficacy of the light emitting device.

The first metal bulk and the second metal bulk may have a thickness of 100 μm or more. According to this embodiment, the first and second metal bulks can support the light emitting structure having a small thickness (i.e., thin), whereby the light emitting device can prevent damage to the light emitting structure by deformation caused by pressure upon separation of a growth substrate.

The first metal bulk and the second metal bulk may have side surfaces protruding beyond a side surface of the light emitting structure. With this structure, the light emitting structure can be protected from external impact, and in use of the light emitting device as a lateral type light emitting device, the light emitting structure does not directly contact a circuit member, thereby improving reliability and luminous efficacy of the light emitting device.

The insulation portion may include an epoxy molding compound.

The second electrode may include a reflective metal layer and a barrier metal layer. The barrier metal layer can prevent a metallic material of the reflective metal layer from diffusing or being contaminated.

The second electrode may include indium tin oxide (ITO) and the lower insulation layer may include a distributed Bragg reflector (DBR). This structure can suppress absorption of light by the second electrode while enhancing luminous efficacy by increasing reflectivity of light.

The light emitting device may further include an electrode protection layer formed on the second electrode. The electrode protection layer prevents AuSn described below from diffusing into the second electrode and reduces a step between the first electrode and the second electrode to allow the light emitting device to be more stably attached to the circuit member such as a printed circuit board, and the like.

The upper insulation layer may cover the lower insulation layer adjoining the second electrode and may adjoin a portion of the second electrode. This structure can more effectively protect the second electrode from moisture and the like. Specifically, even in a structure wherein the second electrode does not cover the barrier metal layer, it is possible to prevent external moisture from entering the reflective metal layer of the second electrode.

The first conductive type semiconductor layer may include a rough surface. With this structure, the light emitting device can reduce a ratio of light returning to the first conductive type semiconductor layer through total reflection at an interface between the first conductive type semiconductor layer and the exterior, thereby improving luminous efficacy.

The light emitting device may further include a wavelength conversion portion disposed on the first conductive type semiconductor layer. With this structure, the light emitting device can realize various colors, particularly, white light, through combination of light emitted from the light emitting structure and light subjected to wavelength conversion through the wavelength conversion portion.

The wavelength conversion portion may include a plurality of phosphor layers. Accordingly, the wavelength conversion portion can convert light emitted from the light emitting structure into light having further various wavelengths.

The light emitting device may include a first pad disposed between the first electrode and the first metal bulk and a second pad disposed between the second electrode and the second metal bulk. The first and second pads can serve to effectively connect the first and second metal bulks to the first electrode and second electrodes, respectively.

The light emitting device may further include a heat dissipation structure disposed on the first metal bulk and the second metal bulk. With this structure, the light emitting device can effectively dissipate heat from the light emitting structure, and thus can be prevented from being damaged by the heat, thereby achieving improvement in reliability and luminous efficacy.

The light emitting device may include one or more holes penetrating the second conductive type semiconductor layer and the active layer and exposing the first conductive type semiconductor layer, wherein the first conductive type semiconductor layer is electrically connected to the first electrode through the holes. Current spreading efficiency and a light emitting pattern of the light emitting device may be adjusted according to the number, locations, and shapes of the holes.

The light emitting structure may include at least one mesa including the active layer and the second conductive type semiconductor layer, and an exposing region formed near a side surface of the mesa and exposing the first conductive type semiconductor layer, wherein the first conductive type semiconductor layer is electrically connected to the first electrode through the exposing region. It is possible to improve efficiency of extracting light generated in the active layer by adjusting the shape of the mesa. The exposing region formed near the side surface of the mesa may be provided in the form of a plurality of holes separated from each other, and current spreading efficiency and the light emitting pattern of the light emitting device may be adjusted according to the number, locations, and shapes of the holes.

The exposing region may be formed to surround the mesa. This structure can improve current spreading efficiency.

In accordance with another exemplary embodiment of the invention, a light emitting device includes: a light emitting structure including a first conductive type semiconductor layer, a second conductive type semiconductor layer disposed on the first conductive type semiconductor layer, and an active layer disposed between the first conductive type semiconductor layer and the second conductive type semiconductor layer; a first electrode electrically connected to the first conductive type semiconductor layer; a second electrode disposed on the second conductive type semiconductor layer and electrically connected to the second conductive type semiconductor layer; a lower insulation layer covering an upper surface of the light emitting structure and upper and side surfaces of the second electrode, the lower insulation layer being disposed between the light emitting structure and the first electrode and insulating the first electrode from the second electrode; an upper insulation layer covering a portion of the first electrode; and a support structure including a first metal bulk and a second metal bulk separated from each other on the upper insulation layer and electrically connected to the first electrode and the second electrode, respectively, and an insulation portion disposed between the first metal bulk and the second metal bulk, wherein a difference in coefficients of thermal expansion represented by the following Equation 2 may be 20% or less.

A difference in coefficients of thermal expansion=
[(A coefficient of thermal expansion of the support structure−a coefficient of thermal expansion of the light emitting structure)/the coefficient of thermal expansion of support structure]×100.     [Equation 2]

According to this exemplary embodiment, the light emitting device exhibits improved heat dissipation and thus can be prevented from being damaged by heat, thereby providing improvement in reliability and luminous efficacy of the light emitting device. Further, since the light emitting device has a small difference in coefficient of thermal expansion, stress applied to the light emitting structure is reduced to prevent damage to the light emitting structure, thereby improving reliability and luminous efficacy of the light emitting device Each of the first metal bulk and the second metal bulk may include at least one material selected from the group consisting of Cu, Mo, W, Cu/Mo and Cu/W. As a result, stress applied to the light emitting structure is low enough to prevent damage to the light emitting structure, thereby improving reliability and luminous efficacy of the light emitting device.

In accordance with a further exemplary embodiment of the invention, a method of fabricating a light emitting device includes: forming a light emitting structure including a first conductive type semiconductor layer formed on a growth substrate, a second conductive type semiconductor layer formed on the first conductive type semiconductor layer, and an active layer formed between the first conductive type semiconductor layer and the second conductive type semiconductor layer; forming a first electrode to be electrically connected to the first conductive type semiconductor layer; forming a second electrode on the second conductive type semiconductor layer to be electrically connected to the second conductive type semiconductor layer; forming a lower insulation layer to cover an upper surface of the light emitting structure and upper and side surfaces of the second electrode and to be disposed between the light emitting structure and the first electrode so as to insulate the first electrode from the second electrode; forming an upper insulation layer to cover a portion of the first electrode to form a plurality of device areas; forming a metal bulk including a plurality of vias on the first electrode and the second electrode; forming an insulation portion to fill the vias therewith; and dividing the plurality of device areas and the metal bulk into individual unit devices to form a plurality of light emitting devices, wherein the first and second metal bulks are electrically connected to the first electrode and the second electrode, respectively, the insulation portion is placed between the first and second metal bulks, and a difference in coefficients of thermal expansion represented by Equation 1 is 20% or less.

A difference in coefficients of thermal expansion=[(a coefficient of thermal expansion of the first metal bulk or a coefficient of thermal expansion of the second metal bulk–a coefficient of thermal expansion of the light emitting structure)/ the coefficient of thermal expansion of the first metal bulk or the second metal bulk]×100.  [Equation 1]

According to this exemplary embodiment, it is possible to fabricate a light emitting device including the metal bulk through a wafer level package process. In addition, since the light emitting device includes the metal bulk, the light emitting structure can be prevented from being damaged upon removal of the growth substrate from the light emitting structure, thereby improving reliability and luminous efficacy of the light emitting device.

The plurality of device areas are divided into individual unit devices along a dividing line, and the metal bulk may include a metal bulk connecting portion formed in a region wherein the dividing line overlaps the insulation portion. Accordingly, it is possible to prevent the insulation portion from melting due to heat from a laser when the plurality of device areas, the metal bulk and the insulation portion are diced along the dividing line by laser dicing, to prevent generation of large resistance due to the presence of a molten portion of the insulation portion between the metal bulk and a circuit member upon operation of the light emitting device, and to prevent deterioration of a function of the insulation portion serving to insulate the first electrode from the second electrode.

The method of fabricating a light emitting device may further include removing the growth substrate from the light emitting structure, and the first metal bulks and the second metal bulks may include Cu/Mo or Cu/W. Accordingly, the first and second metal bulks support the light emitting structure to prevent the light emitting structure from being damaged upon removal of the growth substrate from the light emitting structure, thereby improving reliability and luminous efficacy of the light emitting device.

The method of fabricating a light emitting device may further include forming a support substrate on the metal bulk. The support substrate supports the light emitting structure together with the first and second metal bulks to prevent the light emitting structure from being damaged upon removal of the growth substrate from the light emitting structure, thereby improving reliability and luminous efficacy of the light emitting device.

According to exemplary embodiments of the invention, the light emitting device includes a metal bulk provided to a light emitting structure thereof to improve heat dissipation of the light emitting device, and thus can be prevented from being damaged by heat, thereby providing improvement in reliability and luminous efficacy thereof. In addition, a large difference in coefficient of thermal expansion between the metal bulk and the light emitting structure reduces stress applied to the light emitting structure and prevents damage to the light emitting structure, thereby improving reliability and luminous efficacy of the light emitting device.

The method of fabricating a light emitting device according to exemplary embodiment of the invention can provide a light emitting device including a metal bulk through a wafer level package process, thereby providing process efficiency. In addition, the light emitting device includes the metal bulk and thus can prevent damage to the light emitting structure upon removal of the growth substrate from the light emitting structure, thereby achieving improvement in reliability and luminous efficacy.

DETAILED DESCRIPTION OF THE ILLUSTRATED EMBODIMENTS

Figure 1A:
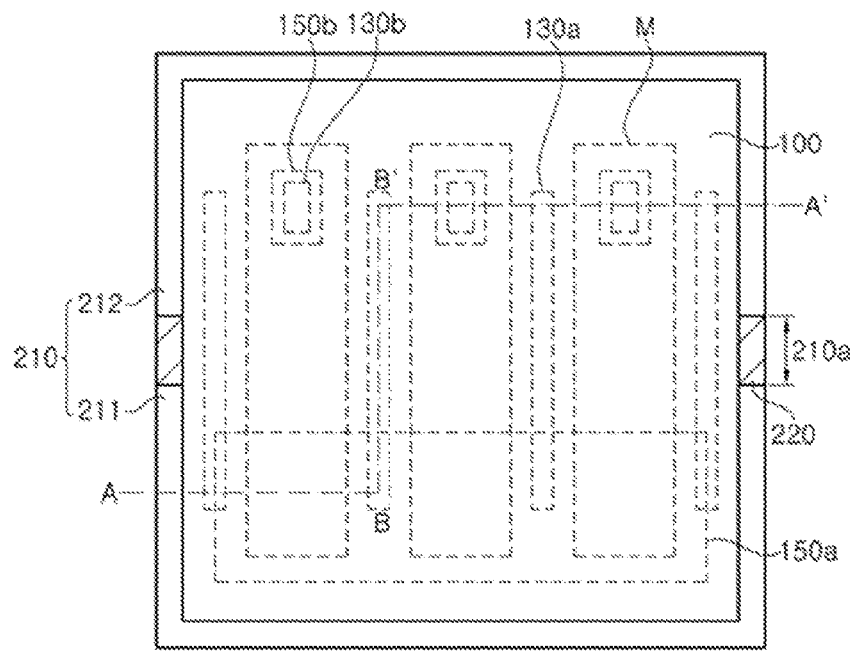
FIG. 1A is a plan view of a light emitting device according to one exemplary embodiment.

Hereinafter, exemplary embodiments of the invention will be described in more detail with reference to the accompanying drawings. The following embodiments are provided by way of example so as to fully convey the spirit of the present invention to those skilled in the art to which the present invention pertains. Accordingly, the present invention is not limited to the embodiments disclosed herein and may also be implemented in different forms. In the drawings, widths, lengths, thicknesses, and the like of elements may be exaggerated for clarity and descriptive purposes. When an element or layer is referred to as being "placed on" or "disposed on" another element or layer, it may be directly "placed on" or "disposed on" the other element or layer or intervening elements or layers may be present. Throughout the specification, like reference numerals denote like elements having the same or similar functions.

Figure 1B:
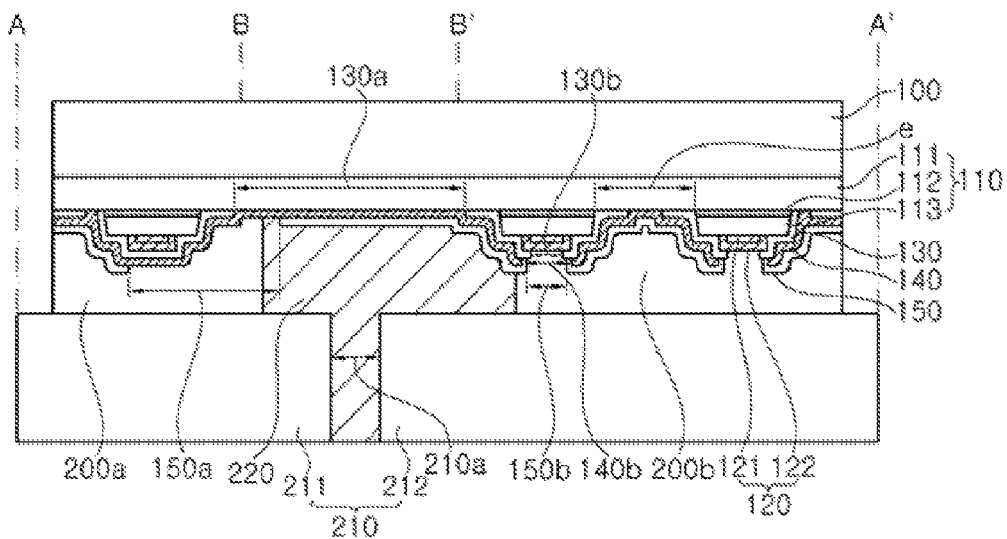
FIG. 1B is a cross-sectional view taken along sectional line A-B-B'-A' of FIG. 1A.

FIG. 1A illustrates a light emitting device according to one exemplary embodiment in a plan view. FIG. 1B is a cross-sectional view taken along lines A-B-B'-A' of FIG. 1A.

Referring to FIGS. 1A and 1B, a light emitting device according to one exemplary embodiment of the invention includes a light emitting structure 110, a first electrode 140, a second electrode 120, a lower insulation layer 130, an upper insulation layer 150, and a support structure.

The light emitting structure 110 includes a first conductive type semiconductor layer 111, a second conductive type semiconductor layer 113 disposed on the first conductive type semiconductor layer 111, and an active layer 112 disposed between the first conductive type semiconductor layer 111 and the second conductive type semiconductor layer 113. Although a growth substrate 100 is formed on the first conductive type semiconductor layer 111 in FIGS. 1A and 1B, the growth substrate 100 may be omitted.

The first conductive type semiconductor layer 111, the active layer 112, and the second conductive type semiconductor layer 113 may include a III-V-based compound semiconductor, and may include, for example, a nitride based semiconductor such as (Al, Ga, In)N. The first conductive type semiconductor layer 111 may include an n-type dopant (for example, Si) and the second conductive type semiconductor layer 113 may include a p-type dopant (for example, Mg), or vice versa. The active layer 112 may include a multi-quantum well (MQW) structure. When forward bias is applied to the light emitting structure 110, light is emitted from the active layer 112 through recombination of electrons and holes therein. The first conductive type semiconductor layer 111, the active layer 112, and the second conductive type semiconductor layer 113 may be grown on the growth substrate 100 by a technique such as metal organic chemical vapor deposition (MOCVD), molecule beam epitaxy (MBE), and the like.

Referring to FIGS. 1A and 1B, the light emitting structure 110 may have the following structure, without being limited thereto. The light emitting structure 110 may include at least one mesa M, which includes the active layer 112 and the second conductive type semiconductor layer 113, and an exposing region (e) placed near a side surface of the mesa M and exposing the first conductive type semiconductor layer 111 such that the first conductive type semiconductor layer 111 is electrically connected to the first electrode 140 through the exposing region (e). The side surface of the mesa M may be formed as an inclined surface by a technique such as photoresist reflow to improve efficiency of extracting light generated in the active layer 112. As described below, the first electrode 140 may be electrically connected to the first conductive type semiconductor layer 111. The first electrode 140 may be electrically connected thereto through the exposing region (e) through which the first conductive type semiconductor layer 111 is partially exposed, without being limited thereto. In this structure, current spreading efficiency and a light emitting pattern of the light emitting device may be adjusted according to the locations, the shape and the number of exposing regions (e). The exposing region (e) may be formed by a photolithography and etching technique. For example, the exposing region (e) may be formed by defining an etching region using a photoresist, followed by etching the second conductive type semiconductor layer 113 and the active layer 112 using dry etching such as ICP etching.

The second electrode 120 is placed on the second conductive type semiconductor layer 113 and may be electrically connected to the second conductive type semiconductor layer 113. The second electrode 120 is formed on each of the mesas M and may have an elongated shape corresponding to the shape of the mesa M. The second electrode 120 includes a reflective metal layer 121 and may further include a barrier metal layer 122, which may cover an upper surface and a side surface of the reflective metal layer 121. For example, the barrier metal layer 122 may be formed to cover the upper and side surfaces of the reflective metal layer 121 by forming a pattern of the reflective metal layer 121, followed by forming the barrier metal layer 122 thereon. For example, the reflective metal layer 121 may be formed by depositing and patterning Ag, Ag alloy, Ni/Ag, NiZn/Ag, or TiO/Ag layers. On the other hand, the barrier metal layer 122 may be formed of Ni, Cr, Ti, Pt, or combinations thereof, and prevents diffusion or contamination of a metallic material of the reflective metal layer 121. In some embodiments, the second electrode 120 may include indium tin oxide (ITO). ITO is composed of a metal oxide having high light transmittance and suppresses absorption of light by the second electrode 120, thereby improving luminous efficacy.

Although not shown in the drawings, an electrode protection layer may be formed on the second electrode 120. Specifically, the electrode protection layer may have a narrower upper area than an opening 130b of the lower insulation layer 130 described below. The electrode protection layer prevents diffusion of AuSn described below into the second electrode 120 and reduces a step between the first electrode 140 and the second electrode 120 to allow the light emitting device to be more stably attached to a circuit member such as a printed circuit board. The electrode protection layer may be formed of the same material as the first electrode 140 during formation of the first electrode 140 and may be formed through deposition and patterning.

The lower insulation layer 130 covers the upper surface of the light emitting structure 110 and the upper and side surfaces of the second electrode 120, and is disposed between the light emitting structure and the first electrode to insulate the first electrode 140 from the second electrode 120. The lower insulation layer 130 has openings 130a, 130b formed in certain regions to allow electrical connection to the first conductive type semiconductor layer 111 and the second conductive type semiconductor layer 113 therethrough. For example, the lower insulation layer 130 may have an opening 130a exposing the first conductive type semiconductor layer 111 and an opening 130b exposing the second electrode 120. The opening 130b of the lower insulation layer 130 may have a smaller area than the opening 130a of the first electrode 140 described below. The lower insulation layer 130 may be formed by chemical vapor deposition (CVD) and the like, and may be composed of an oxide layer such as $SiO_2$, a nitride layer such as $SiN_x$, an insulation layer of $MgF_2$, and the like. The lower insulation layer 130 may be composed of a single layer or multiple layers. Furthermore, the lower insulation layer 130 may include a distributed Bragg reflector (DBR) in which a low refractive material layer and a high refractive material layer are stacked one above another. For example, a reflective insulation layer having high reflectivity may be formed by stacking $SiO_2/TiO_2$ layers or $SiO_2/Nb_2O_5$ layers.

The first electrode 140 may be electrically connected to the first conductive type semiconductor layer 111. The first electrode 140 may be electrically connected to the first conductive type semiconductor layer 111 through the opening 130a of the lower insulation layer 130. The first electrode 140 may cover the light emitting structure 110. In addition, the first electrode 140 may include an opening 140b exposing the second electrode 120. The opening 140b has a larger area than the opening 130b of the lower insulation layer 130 to expose the opening 130b. The first electrode 140 may be formed over the overall upper area of the growth substrate 100 excluding the opening 140b. Accordingly, electric current can be easily spread substantially over the overall upper area of the growth substrate 100 through the first electrode 140. The first electrode 140 may include a highly reflective metal layer such as an Al layer, and the high reflective metal layer may be formed on a bonding layer such as a Ti, Cr or Ni layer. In addition, a protective layer having a monolayer or composite layer structure of Ni, Cr, Au and the like may be formed on the highly reflective metal layer. The first electrode 140 may have a multilayer structure of, for example, Ti/Al/Ti/Ni/Au layers. The first electrode 140 may be formed by deposition of a metallic material onto the lower insulation layer 130, followed by patterning the deposited metallic material.

The upper insulation layer 150 may cover a portion of the first electrode 140. The upper insulation layer 150 may have an opening 150a exposing the first electrode 140 and an opening 150b exposing the second electrode 120. The opening 150b of the upper insulation layer 150 has a narrower area than the opening 140b of the first electrode 140 and a larger area than the opening 130b of the lower insulation layer 130. Accordingly, sidewalls of the opening 140b of the first electrode 140 may be covered by the upper insulation layer 150. The upper insulation layer 150 may be formed by depositing an oxide insulation layer, a nitride insulation layer, or a polymer, such as polyimide, Teflon, or Parylene, on the first electrode 140, followed by patterning.

The support structure includes a first metal bulk 211 and a second metal bulk 212 separated from each other on the upper insulation layer 150 and electrically connected to the first electrode 140 and the second electrode 120, respectively, and an insulation portion 220 disposed between the first metal bulk 211 and the second metal bulk 212.

The first and second metal bulks 211, 212 may be electrically connected to the first and second electrodes 140, 120 through the openings 150a, 150b of the upper insulation layer 150, respectively. The first and second metal bulks 211, 212 may be joined to the first electrode and the second electrode via solders 200a, 200b disposed between the first and second metal bulks 211, 212 and the first electrode and second electrode 140, 120. As the solders 200a, 200b, for example, AuSn may be used. As the light emitting device includes the first and second metal bulks 211, 212, heat generated from the light emitting structure 110 of the light emitting device can be effectively discharged through the first and second metal bulks 211, 212 upon operation, whereby the light emitting device can be prevented from being damaged by heat, thereby achieving improvement in reliability and luminous efficacy.

The first and second metal bulks 211, 212 can effectively discharge heat from the light emitting structure 110 to the outside, and may include a material which has a similar coefficient of thermal expansion to the coefficient of thermal expansion of the light emitting structure 110. Specifically, the first and second metal bulks 211, 212 may include Cu/Mo or Cu/W.

The first and second metal bulks 211, 212 may protrude beyond the side surface of the light emitting structure 110. When the light emitting device includes the growth substrate 100, the first and second metal bulks 211, 212 may protrude beyond the side surface of the growth substrate 100. With this structure, the light emitting device can protect the light emitting structure 110 from external impact, and when the light emitting device is used as a lateral type light emitting device, the light emitting structure 110 and the growth substrate 100 do not directly contact the circuit member, thereby improving reliability and luminous efficacy of the light emitting device. As used herein, the term "metal bulk" means a metal portion having a thickness of a micrometer scale. Particularly, the first and second metal bulks 211, 212 may have a thickness of 100 µm or more. Accordingly, the first and second metal bulks 211, 212 can support the light emitting structure 110 having a small thickness or otherwise being thin, whereby the light emitting device can prevent damage to the light emitting structure 110 by deformation caused by pressure upon separation of the growth substrate 100.

The insulation portion 220 insulates the first and second metal bulks 211, 212 to insulate the first and second electrodes 140, 120 from each other, fills a space between the first and second metal bulks 211, 212 to improve durability, and serves to relieve stress upon thermal expansion of the first and second metal bulks 211, 212. The insulation portion 220 may include an epoxy molding compound (EMC).

According to this exemplary embodiment, the first metal bulk 211 and the second metal bulk 212 are separated from each other, and the insulation portion 220 receives some extent of expansion of the first and second metal bulks 211, 212. Accordingly, it is possible to relieve stress applied to the light emitting structure 110 due to thermal expansion of the first and second metal bulks 211, 212.

Furthermore, the light emitting device according to the exemplary embodiment of the invention may have a coefficient of thermal expansion of 20% or less as represented by Equation 1.

A difference in coefficients of thermal expansion=[(a coefficient of thermal expansion of the first metal bulk or a coefficient of thermal expansion of the second metal bulk–a coefficient of thermal expansion of the light emitting structure)/ the coefficient of thermal expansion of the first metal bulk or the second metal bulk]×100.   [Equation 1]

Herein, the difference in coefficient of thermal expansion is a value calculated by percentage of a difference between the coefficient of thermal expansion of first or second metal bulks 211, 212 and the coefficient of thermal expansion of the light emitting structure 110 to the coefficient of thermal expansion of the first or second metal bulks 211, 212. When the difference in coefficient of thermal expansion represented by Equation 1 is 20% or less, stress applied to the light emitting structure 110 due to thermal expansion of the first or second metal bulks 211, 212 is low enough to prevent damage to the light emitting structure 110, thereby improving reliability and luminous efficacy of the light emitting device.

A light emitting device according to another exemplary embodiment of the invention is similar to the light emitting device described above with reference to FIGS. 1A and 1B, and may have a difference in coefficients of thermal expansion of 20% or less, as represented by Equation 2 instead of Equation 1.

A difference in coefficients of thermal expansion=[(a coefficient of thermal expansion of the support structure–a coefficient of thermal expansion of the light emitting structure)/a coefficient of thermal expansion of the support structure]×100.   [Equation 2]

According to this exemplary embodiment of the invention, stress applied to the light emitting structure 110 due to thermal expansion of the support structure is low enough to prevent damage to the light emitting structure 110, thereby improving reliability and luminous efficacy of the light emitting device.

In the light emitting device according to this exemplary embodiment, the first metal bulk 211 and the second metal bulk 212 may include at least one material selected from the group consisting of Cu, Mo, W, Cu/Mo, and Cu/W. According to this exemplary embodiment, stress applied to the light emitting structure 110 due to thermal expansion of the support structure is low enough to prevent damage to the light emitting structure 110, thereby improving reliability and luminous efficacy of the light emitting device.

Figure 2A:
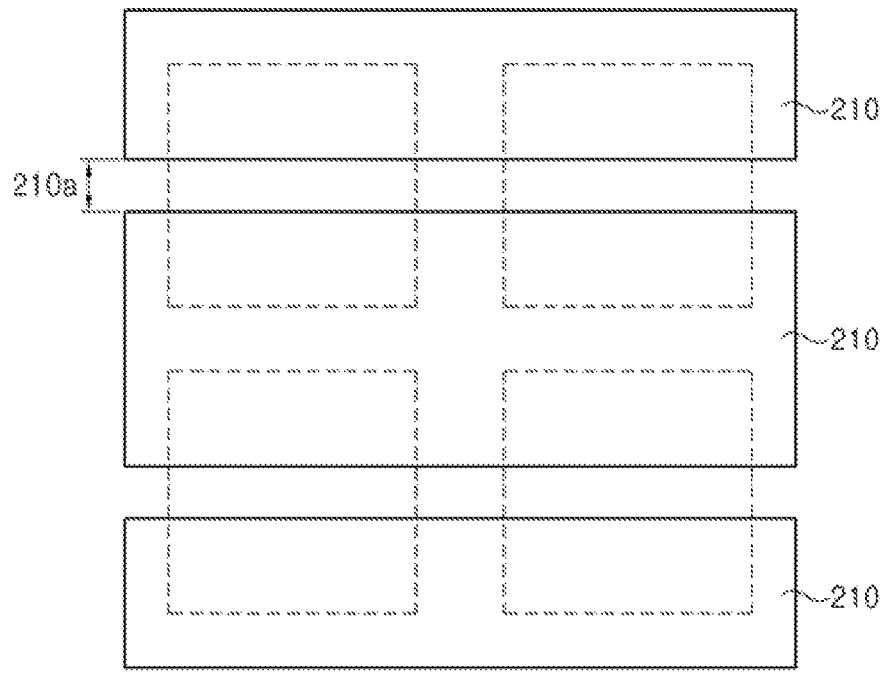
FIG. 2A and FIG. 2B are plan views illustrating a method of fabricating a light emitting device according to an exemplary embodiment.
Figure 2B:
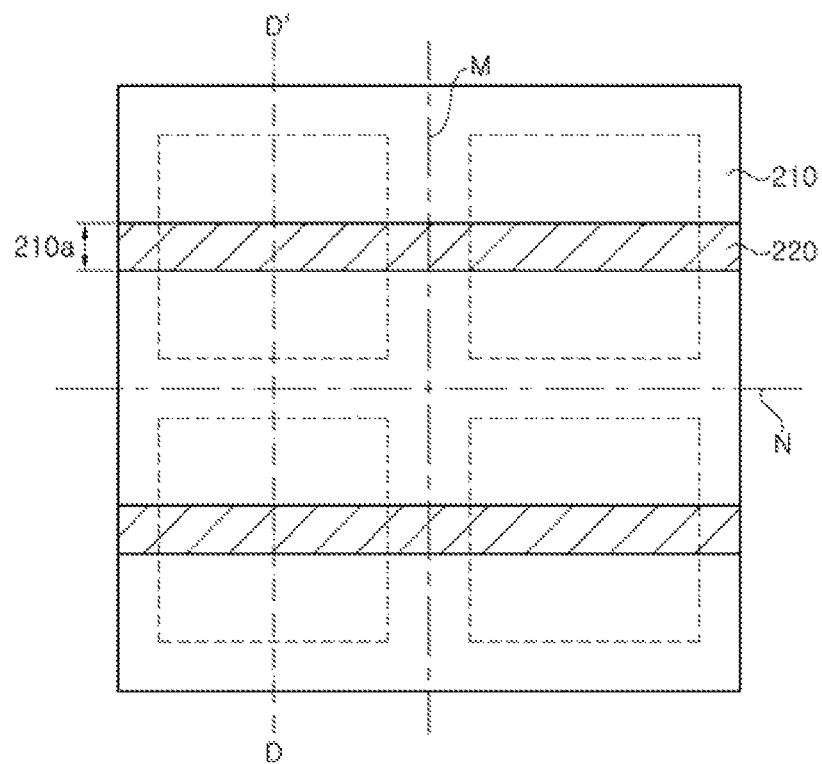
Figure 3A:
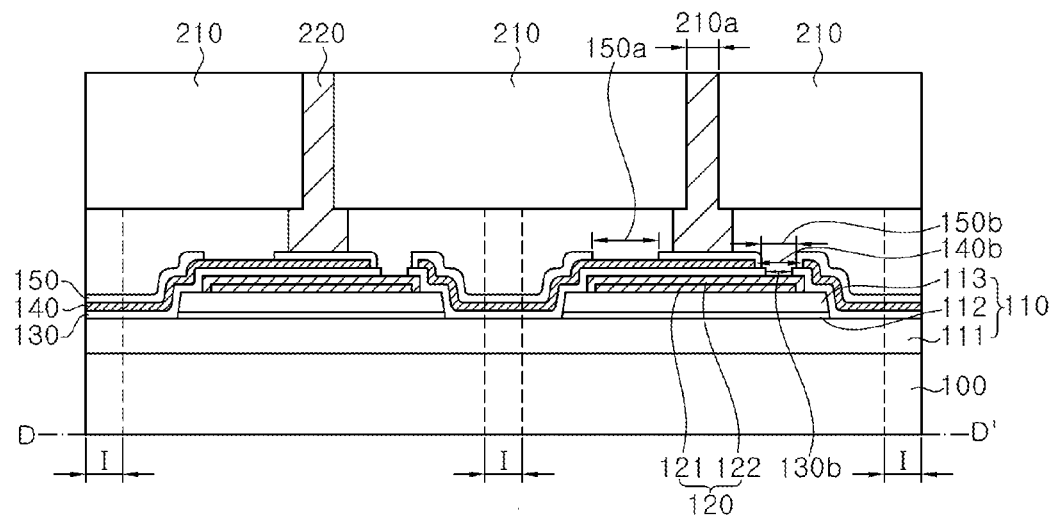
FIG. 3A and FIG. 3B are cross-sectional views taken along sectional line D-D' of FIG. 2B.
Figure 3B:
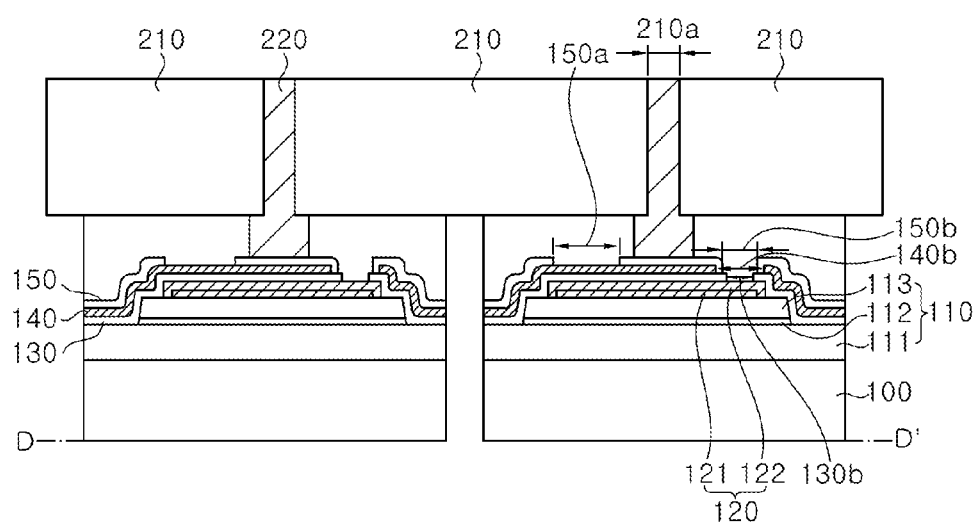

FIG. 2A and FIG. 2B are plan views illustrating a method of fabricating a light emitting device according to an exemplary embodiment. FIGS. 3A and 3B are cross-sectional views taken along sectional line D-D' of FIG. 2B.

Referring to FIG. 2A, a plurality of device areas each including a light emitting structure 110, a first electrode 140, a second electrode 120, a lower insulation layer 130, and an upper insulation layer 150 as described with reference to FIGS. 1A and 1B is first prepared. Then, a metal bulk 210 including a plurality of vias 210a is formed on the first and second electrodes 140, 120. Specifically, after a solder 200 is deposited on the first and second electrodes 140, 120, the metal bulk 210 is formed on the first and second electrodes 140, 120 via the solder 200. For example, AuSn may be used as the solder 200, and the metal bulk 210 may be disposed on AuSn after AuSn is deposited by soldering, photolithography, screen printing, and the like. The plurality of vias 210a may be disposed between a portion of the metal bulk 210 adjoining the first electrode 140 and a portion of the metal bulk 210 adjoining the second electrode 120.

Referring to FIG. 2B, an insulation portion 220 is formed such that the vias 210a are filled therewith. The insulation portion 220 may be formed by screen printing or dispensing, without being limited thereto. In formation of the insulation portion 220, a material of the insulation portion 220 remaining on the surface of the metal bulks 210 may be removed by grinding or chemical mechanical polishing (CMP).

FIGS. 3A and 3B are cross-sectional views taken along sectional line D-D' of FIG. 2B. The method of fabricating the light emitting device of FIGS. 1A and 1B will be described in more detail with reference to FIGS. 3A and 3B, but is not limited thereto.

Referring to FIG. 3A, after the metal bulk 210 is attached to the first electrode 140 and the second electrode 120, an isolation (ISO) process may be performed such that the first and second metal bulks 211, 212 of the plural light emitting devices protrude beyond side surfaces of the light emitting structure 110 and the growth substrate 100. As a result, the fabricated light emitting device can protect the light emitting structure 110 from external impact, and when the fabricated light emitting device is used as a lateral type light emitting device, the light emitting structure 110 and the growth substrate 100 do not directly contact a circuit member, thereby improving reliability and luminous efficacy of the light emitting device. The ISO process may be performed using photolithography and etching technology. An etching area I is defined using a photoresist, followed by etching the growth substrate 100 and the first conductive type semiconductor layer 111 using dry etching such as ICP etching.

It should be understood that the present invention is not limited thereto. For example, in order to obtain a structure of a light emitting device as shown in FIG. 13A, FIG. 13B, FIG. 14A, and FIG. 14B, the lower insulation layer 130, the first electrode 140, and the upper insulation layer 150 may also be subjected to etching in addition to etching of the growth substrate 100 and the first conductive type semiconductor layer 111.

According to a further exemplary embodiment of the invention, in order to obtain the structure of the light emitting device of FIGS. 1A and 1B, the solder 200 may also be subjected to etching in addition to etching of the growth substrate 100, the first conductive type semiconductor layer 111, the lower insulation layer 130, the first electrode 140, and the upper insulation layer 150.

Thereafter, referring to FIG. 3B, the plurality of device areas, the metal bulk 210 and the insulation portion 220 are divided into individual unit devices, thereby forming a plurality of light emitting devices. For example, the plurality of device areas, the metal bulk 210 and the insulation portion 220 are diced along dicing lines M and N to form the plurality of light emitting devices. A dicing method may include laser dicing and chemical etching, without being limited thereto. Before dicing, the metal bulk is electrically connected to both the first electrode 140 and the second electrode 120. The first electrode 140 and the second electrode 120 may be electrically isolated from each other by dicing the plurality of device areas, the metal bulk 210 and the insulation portion 220 along the dicing line M. The dicing line M may be shifted depending upon the size of an individual device to be used. As a result, it is possible to fabricate a light emitting device including the metal bulk 210 through a wafer level package process.

Figure 4:
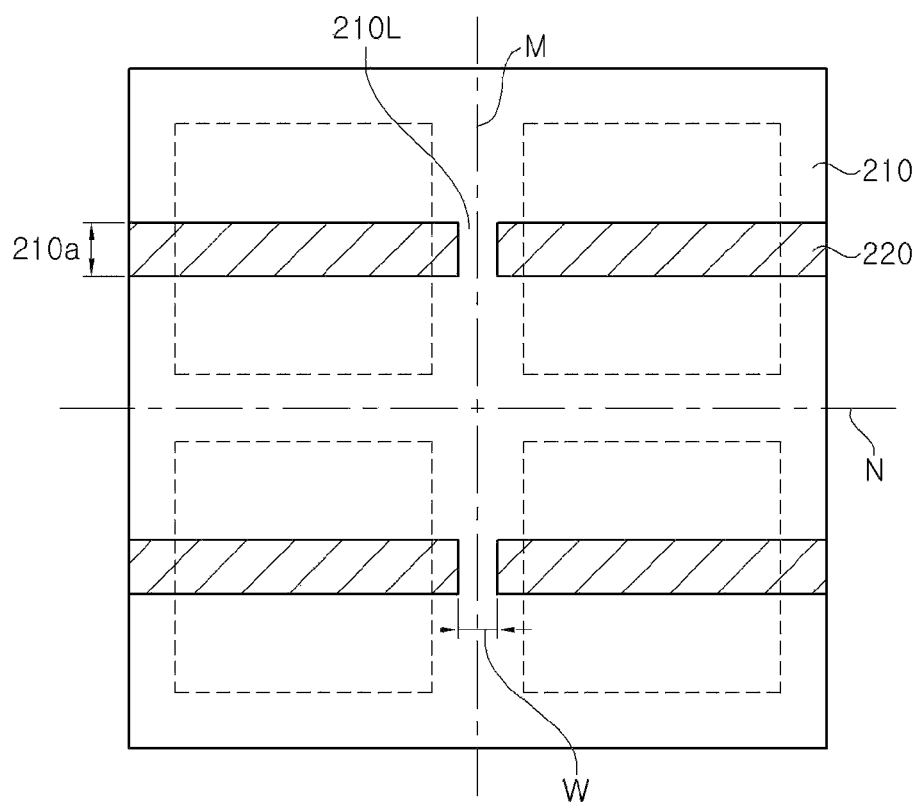
FIG. 4 is a plan view illustrating a method of fabricating a light emitting device according to a further exemplary embodiment.

FIG. 4 is a plan view illustrating a method of fabricating a light emitting device according to a further exemplary embodiment. Referring to FIG. 4, the method of fabricating a light emitting device according to this exemplary embodiment is different from the method described with reference to FIGS. 2A, 2B, 3A, and 3B in that the metal bulk 210 according to this exemplary embodiment may include a metal bulk connecting portion 210L formed in a region where the dicing line overlaps the insulation portion 220. This structure can prevent the insulation portion 220 from being damaged, for example, melting, due to heat from a laser, when the plurality of device areas, the metal bulk 210 and the insulation portion 220 are diced along a dividing line M by laser dicing, can prevent generation of high resistance due to the presence of the damaged portion of the insulation portion 220 between the metal bulk 210 and a circuit member upon operation of the light emitting device, and can prevent deterioration of a function of the insulation portion 220 serving to insulate the first electrode 140 from the second electrode 120. Specifically, since the metal bulk connecting portion 210L prevents the insulation portion 220 from being affected by a laser beam, or allows the insulation portion 220 to meet a laser beam under the surface of the metal bulk, the metal bulk connecting portion 210L can prevent the damaged portion of the insulation portion 220 from remaining on the surface of the metal bulk 210, and can secure effective insulation between the first electrode 140 and the second electrode 120. The metal bulk connecting portion 210L may have a width W of 10 μm to 40 μm and a laser beam used in dicing has a greater width than the width W of the metal bulk connecting portion 210L such that the first electrode and the second electrode 140, 120 are insulated from each other after dicing.

Figure 5A:
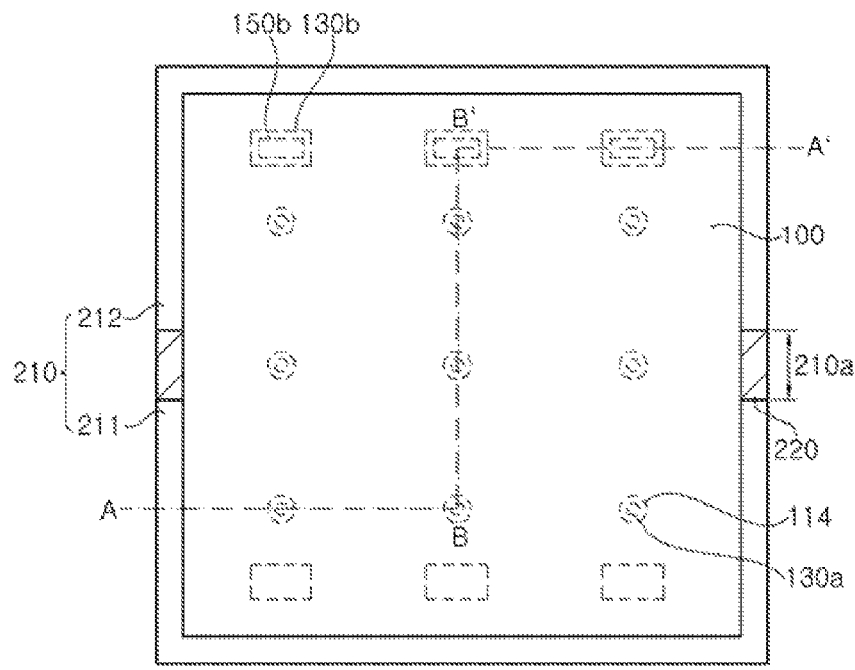
FIG. 5A is a plan view of a light emitting device according to an exemplary embodiment.
Figure 5B:
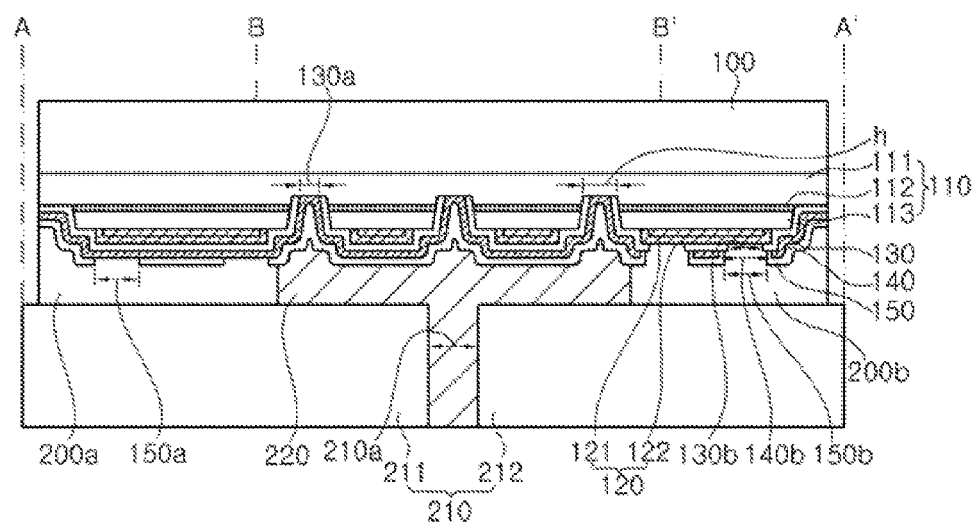
FIG. 5B is a cross-sectional view taken along sectional line A-B-B'-A' of FIG. 5A.

FIG. 5A is a plan view of a light emitting device according to an exemplary embodiment. FIG. 5B is a cross-sectional view taken along sectional line A-B-B'-A' of FIG. 5A. Referring to FIGS. 5A and 5B, the light emitting device according to this exemplary embodiment is different from the light emitting device of FIGS. 1A and 1B in that the light emitting device according to this exemplary embodiment does not include a mesa M and includes one or more holes h formed through the second conductive type semiconductor layer 113 and the active layer 112 to expose the first conductive type semiconductor layer 111, wherein the first conductive type semiconductor layer 111 is electrically connected to the first electrode 140 through the holes h. As shown in FIGS. 5A and 5B, the holes h may be formed in a regular pattern, without being limited thereto. Current spreading efficiency and a light emitting pattern of the light emitting device may be adjusted according to the number, locations, and shapes of the holes h.

Figure 6A:
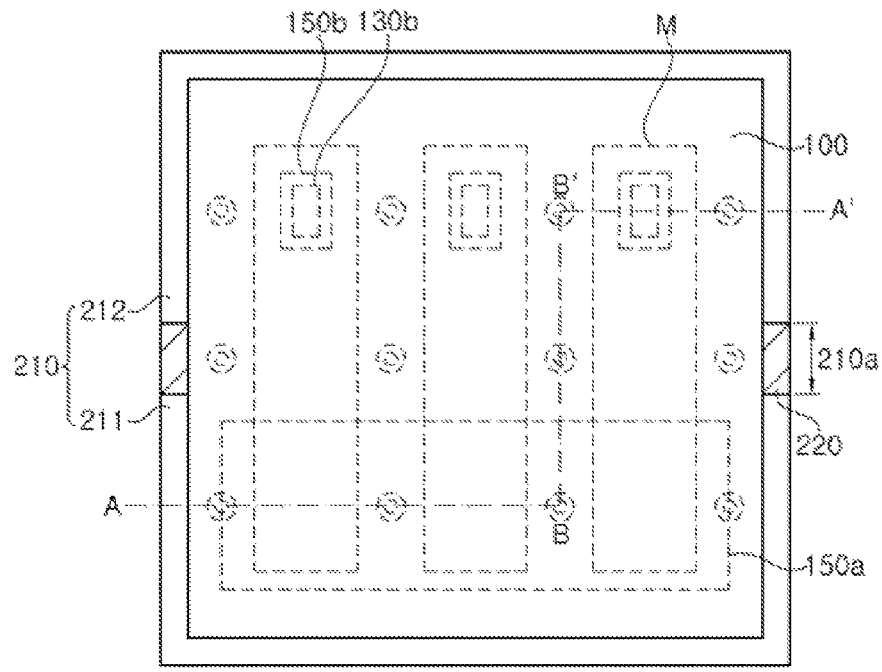
FIG. 6A is a plan view of a light emitting device according to an exemplary embodiment.
Figure 6B:
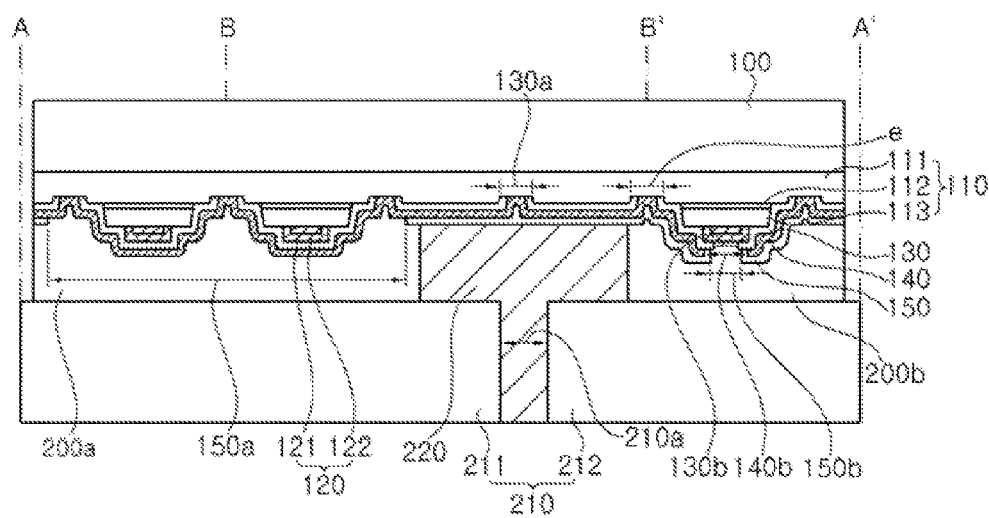
FIG. 6B is a cross-sectional view taken along sectional line A-B-B'-A' of FIG. 6A.

FIG. 6A is a plan view of a light emitting device according to an exemplary embodiment. FIG. 6B is a cross-sectional view taken along sectional line A-B-B'-A' of FIG. 6A. Referring to FIGS. 6A and 6B, the light emitting device according to this exemplary embodiment is different from the light emitting device of FIGS. 1A and 1B in that the light emitting structure 110 according to this exemplary embodiment includes at least one mesa M including the active layer 112 and the second conductive type semiconductor layer 113, and an exposing region (e) placed near a side surface of the mesa M and exposing the first conductive type semiconductor layer 111, wherein the first conductive type semiconductor layer 111 is electrically connected to the first electrode 140 through the exposing region (e), and the exposing region (e) is formed in the form of a plurality of holes separated from each other. As shown in FIGS. 6A and 6B, the holes may be arranged in a regular pattern, without being limited thereto. Current spreading efficiency and a light emitting pattern of the light emitting device may be adjusted according to the number, locations, and shapes of the holes.

Figure 7A:
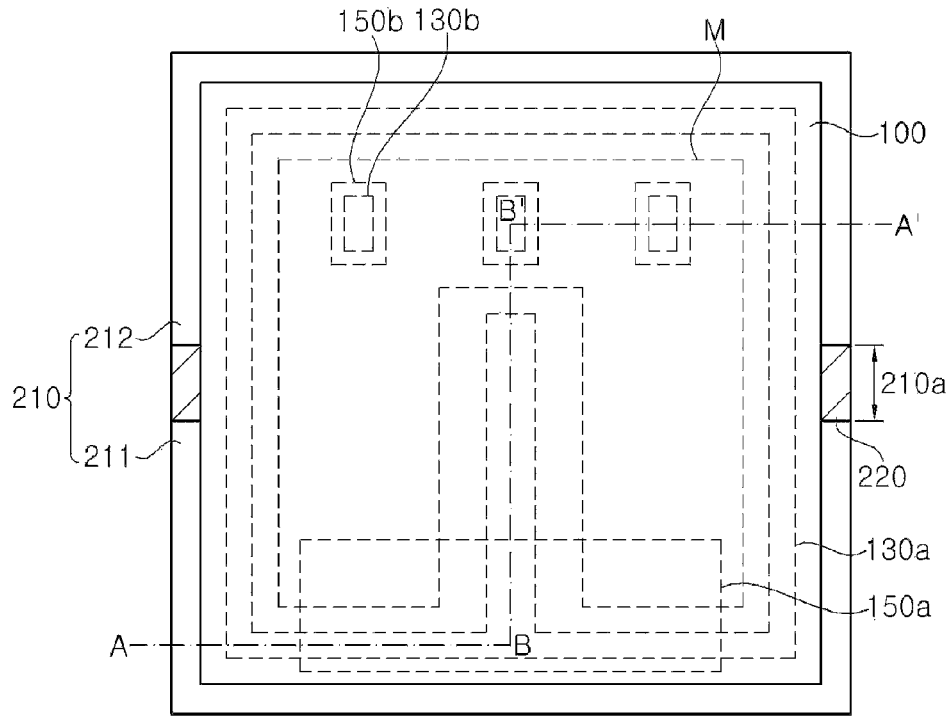
FIG. 7A is a plan view of a light emitting device according to an exemplary embodiment.
Figure 7B:
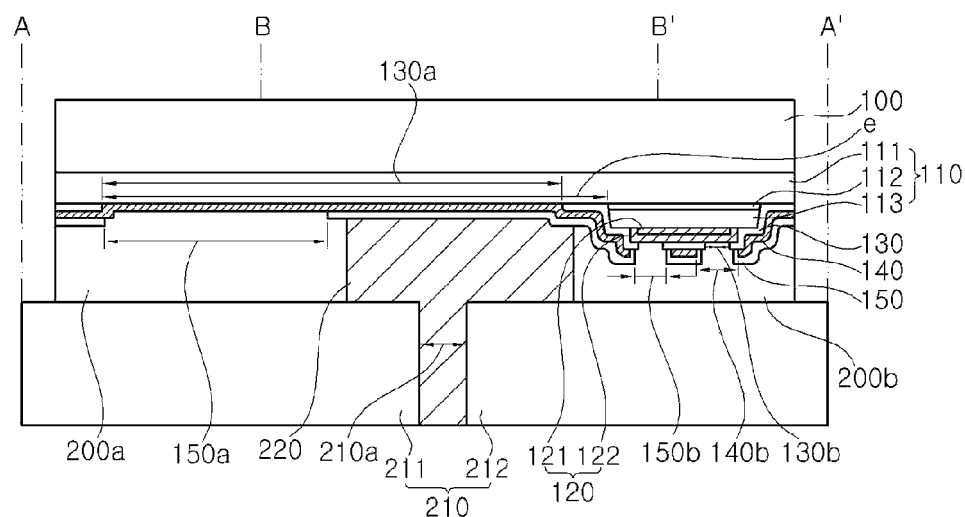
FIG. 7B is a cross-sectional view taken along sectional line A-B-B'-A' of FIG. 7A.

FIG. 7A is a plan view of a light emitting device according an exemplary embodiment. FIG. 7B is a cross-sectional view taken along sectional line A-B-B'-A' of FIG. 7A. Referring to FIGS. 7A and 7B, the light emitting device according to this exemplary embodiment is different from the light emitting device of FIGS. 1A and 1B in that the exposing region (e) is formed to surround the mesa M. The exposing region (e) is formed near a side surface of the light emitting structure 110 to surround the mesa M, and, specifically, may be enlarged in an inner area of a concave portion of the mesa M. This structure can improve current spreading efficiency.

Figure 8A:
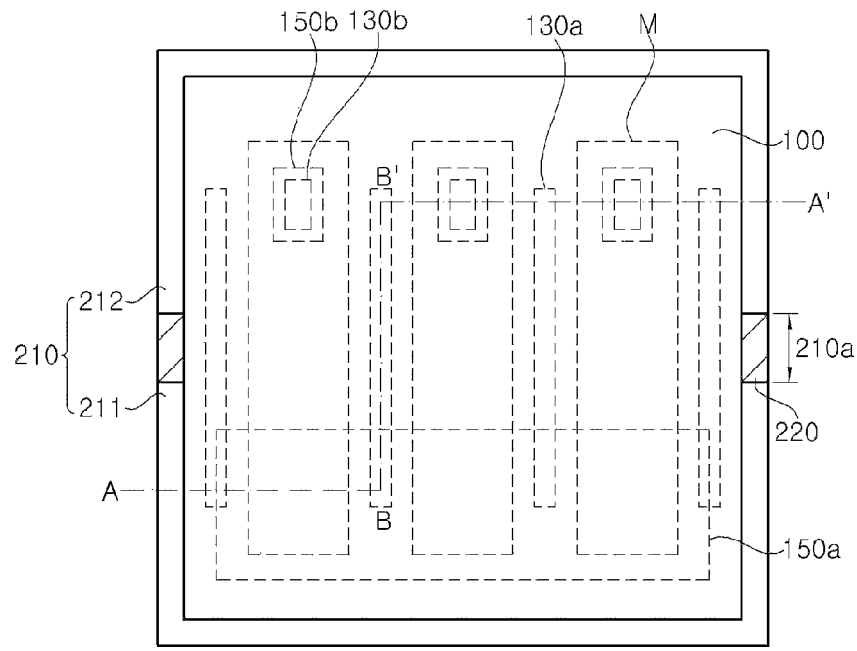
FIG. 8A is a plan view of a light emitting device according to an exemplary embodiment.
Figure 8B:
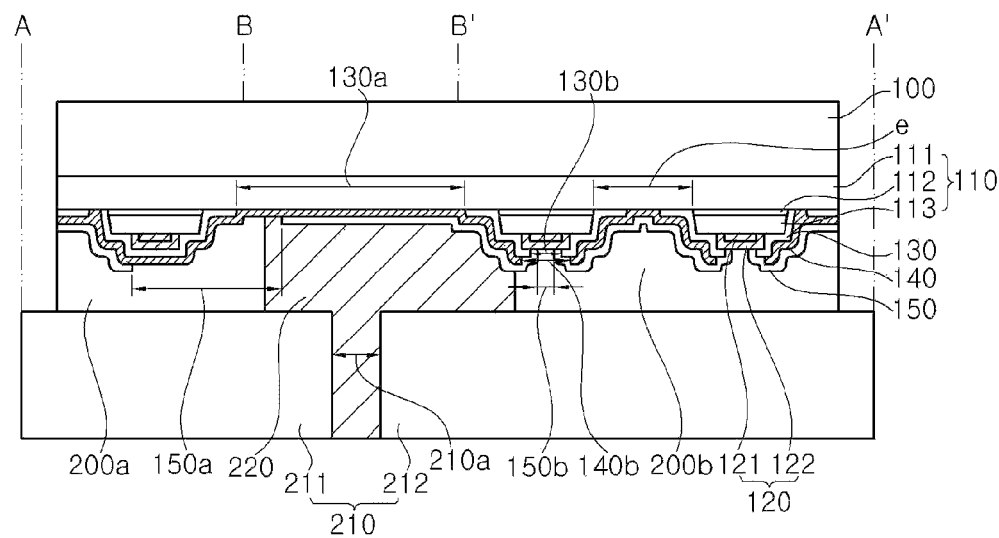
FIG. 8B is a cross-sectional view taken along sectional line A-B-B'-A' of FIG. 8A.

FIG. 8A is a plan view of a light emitting device according to an exemplary embodiment. FIG. 8B is a cross-sectional view taken along sectional line A-B-B'-A' of FIG. 8A. Referring to FIGS. 8A and 8B, the light emitting device according to this exemplary embodiment is different from the light emitting device of FIGS. 1A and 1B in that the upper insulation layer 150 according to this exemplary embodiment covers the lower insulation layer 130 adjoining the second electrode 120 and may adjoin a portion of the second electrode 120. Specifically, the opening 150b of the upper insulation layer 150 has a smaller area than the opening 130b of the lower insulation layer 130. Accordingly, not only sidewalls of the opening 140b of the first electrode 140 but also sidewalls of the lower insulation layer 130 may be covered with the upper insulation layer 150. According to this exemplary embodiment, the light emitting device can more effectively protect the second electrode 120 from moisture and the like. Specifically, even in the case where the second electrode 120 does not include a barrier metal layer, the light emitting device according to this exemplary embodiment can prevent external moisture from entering the reflective metal layer of the second electrode 120.

Figure 9A:
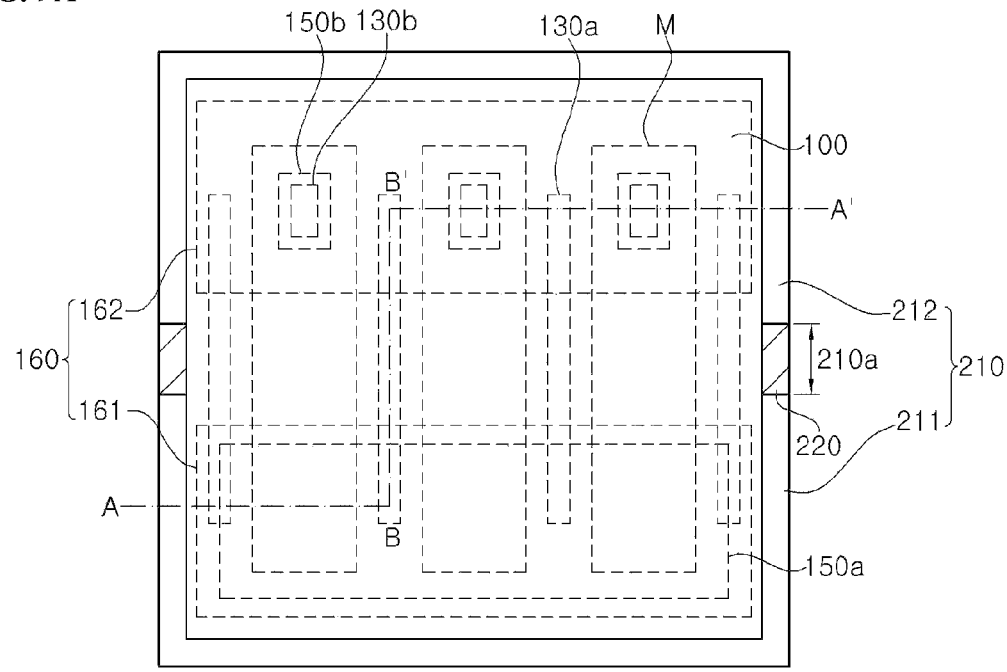
FIG. 9A is a plan view of a light emitting device according to an exemplary embodiment.
Figure 9B:
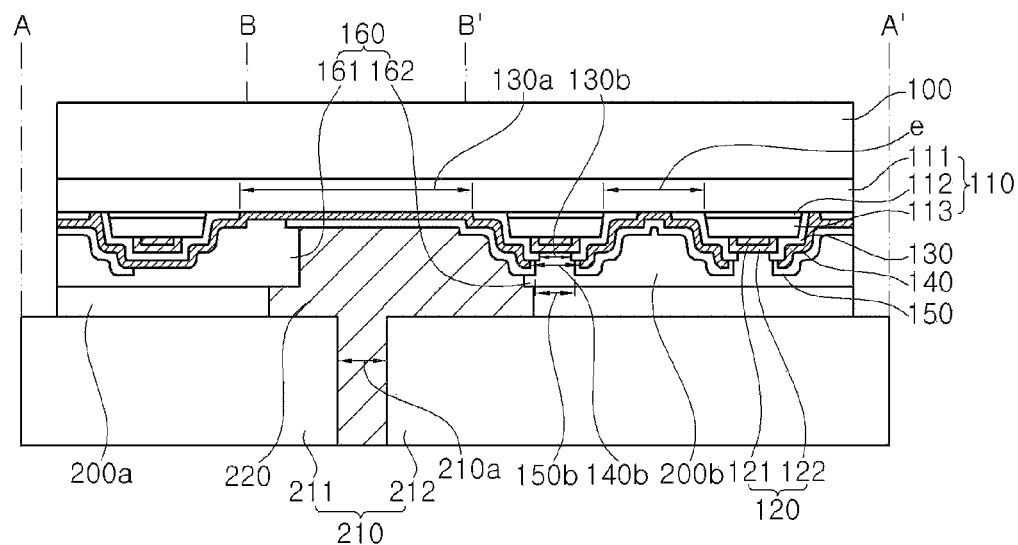
FIG. 9B is a cross-sectional view taken along sectional line A-B-B'-A' of FIG. 9A.

FIG. 9A is a plan view of a light emitting device according an exemplary embodiment. FIG. 9B is a cross-sectional view taken along sectional line A-B-B'-A' of FIG. 9A. Referring to FIGS. 9A and 9B, the light emitting device according to this exemplary embodiment is different from the light emitting device of FIGS. 1A and 1B in that the light emitting device according to this exemplary embodiment includes a first pad 161 disposed between the first electrode 140 and the first metal bulk 211, and a second pad 162 disposed between the second electrode 120 and the second metal bulk 212. The first pad 161 is connected to the first electrode 140 through the opening 150a of the upper insulation layer 150 and the second pad 162 is connected to the second electrode 120 through the opening 150b of the upper insulation layer 150. The first and second pads 161,162 serve to allow the first and second metal bulks 211, 212 to be effectively connected to the first and second electrodes 140, 120, respectively. The first and second pads 161,162 may be formed at the same time by the same process, for example, photolithography and etching, or a lift-off technique. The first and second pads 161,162 may include a bonding layer such as a Ti, Cr, or Ni layer, and a highly conductive metal layer such as an Al, Cu, Ag, or Au layer.

Figure 10A:
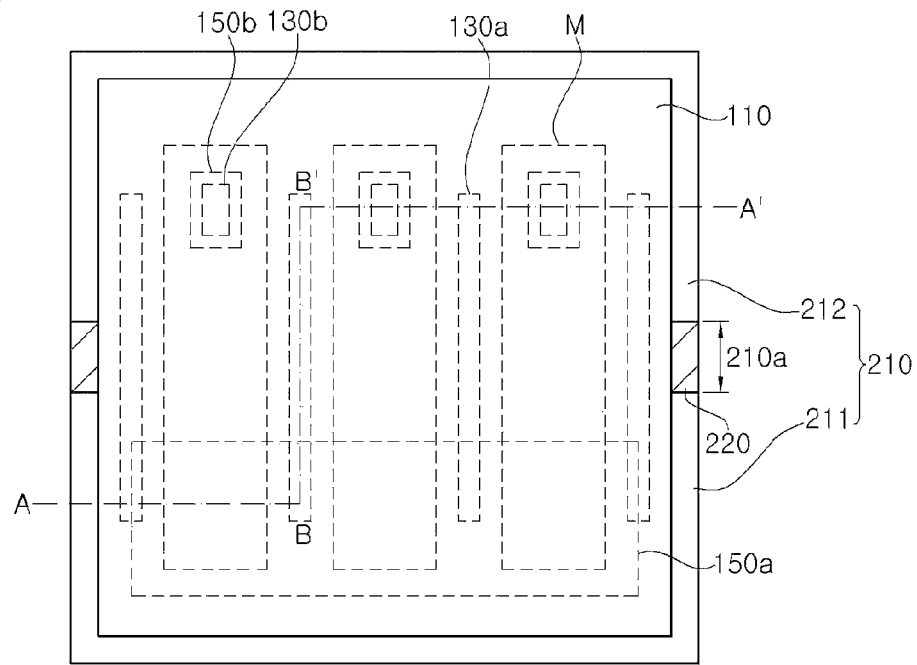
FIG. 10A is a plan view illustrating a light emitting device according to an exemplary embodiment and a method of fabricating the same.
Figure 10B:
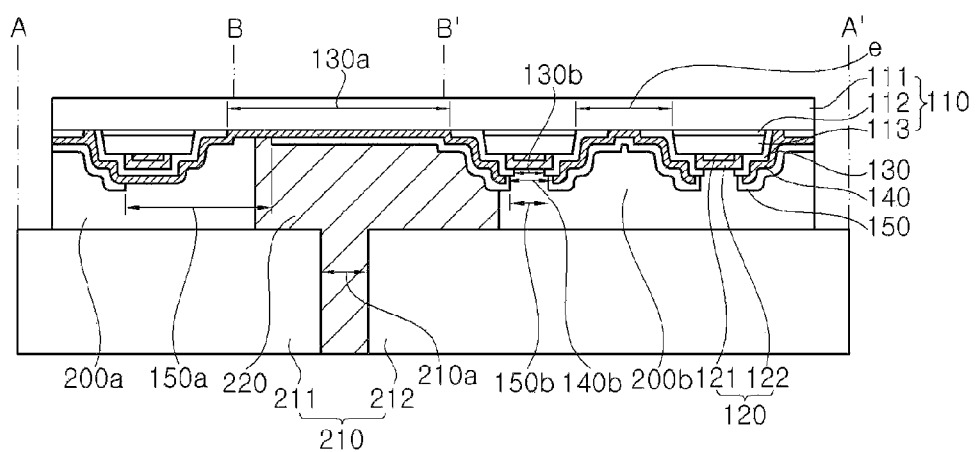
FIG. 10B is a cross-sectional view taken along sectional line A-B-B'-A' of FIG. 10A.
Figure 11A:
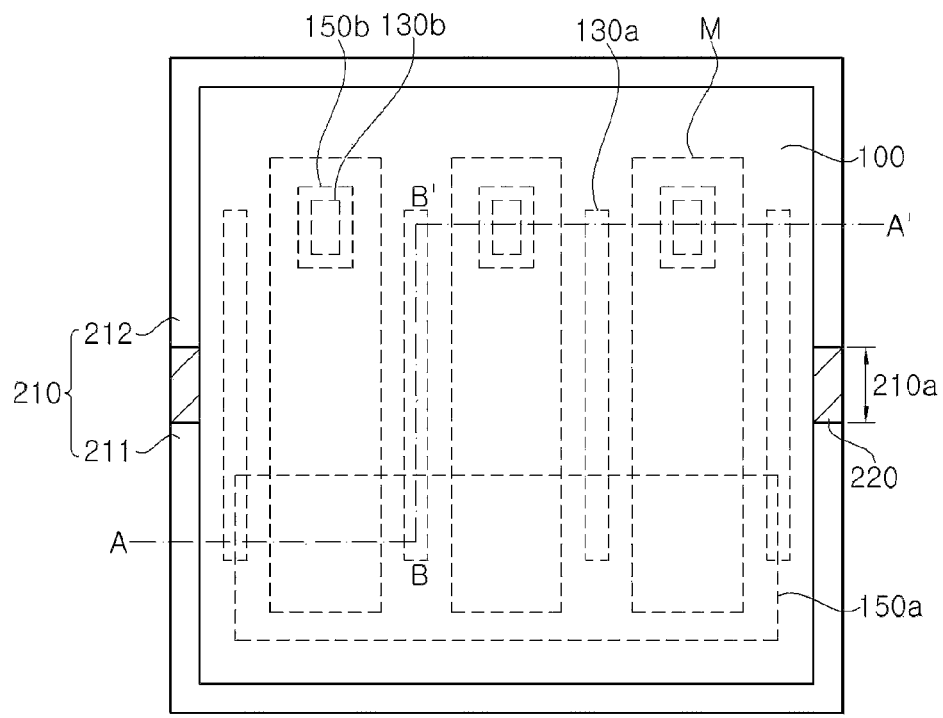
FIG. 11A is a plan view illustrating a light emitting device according to an exemplary embodiment and a method of fabricating the same.
Figure 11B:
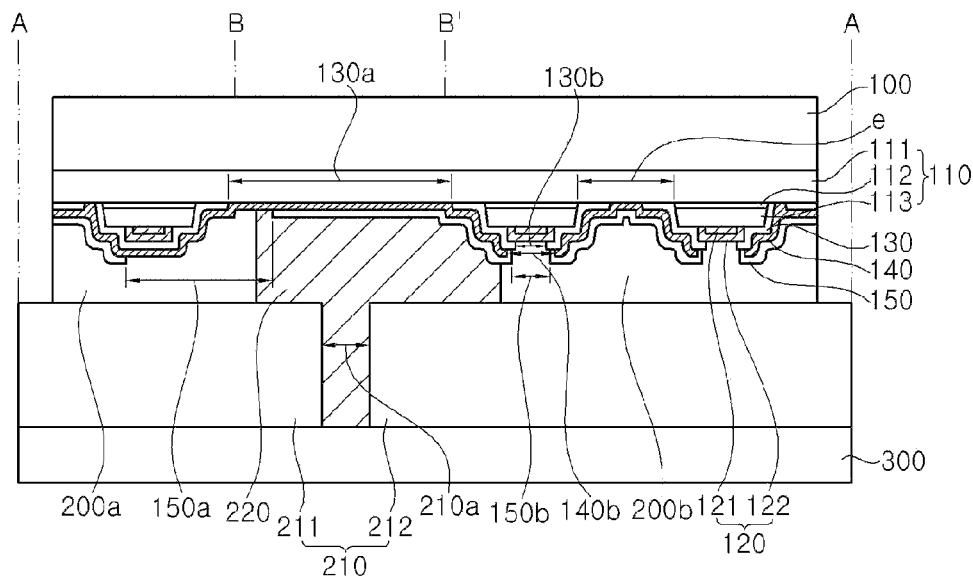
FIG. 11B is a cross-sectional view taken along sectional line A-B-B'-A' of FIG. 11A.

FIG. 10A is a plan view illustrating a light emitting device according to an exemplary embodiment and a method of fabricating the same. FIG. 10B is a cross-sectional view taken along sectional line A-B-B'-A' of FIG. 10A. FIG. 11A is a plan view illustrating a light emitting device accruing to an exemplary embodiment and a method of fabricating the same. FIG. 11B is a cross-sectional view taken along sectional line A-B-B'-A' of FIG. 11A.

Referring to FIGS. 10A and 10B, the light emitting device according to this exemplary embodiment is different from the light emitting device of FIGS. 1A and 1B in that the growth substrate 100 is removed from the light emitting device according to this exemplary embodiment. As the growth substrate 100 is removed from the light emitting device, it is possible to solve problems such as absorption of light by the growth substrate 100, reduction in light intensity by the growth substrate 100, and the like, upon generation of light in the light emitting structure 110. The growth substrate 100 may be removed from the light emitting structure by various techniques for separation of substrates, such as laser lift-off, chemical lift-off, stress lift-off, and the like, after formation of the first and second metal bulks 211, 212. For example, a U-GaN layer may be present between the growth substrate 100 and the first conductive type semiconductor layer 111 and the growth substrate 100 may be separated by dissociation of the U-GaN layer through illumination with a laser beam. The first and second metal bulks 211, 212 support the light emitting structure 110 and can prevent damage to the light emitting structure 110 upon removal of the growth substrate 100 from the light emitting structure 110, thereby improving reliability and luminous efficacy of the light emitting device. In order to provide the aforementioned effect by supporting the light emitting structure 110, it is desirable that the first and second metal bulks 211, 212 have a thickness of 100 μm or more.

Referring to FIGS. 11A and 11B, the method may further include forming a support substrate 300 on the first and second metal bulks 211, 212 before separation of the growth substrate 100 in FIGS. 10A and 10B. The support substrate 300 supports the light emitting structure 110 together with the first and second metal bulks 211, 212 and thus can prevent damage to the light emitting structure 110 upon removal of the growth substrate 100 from the light emitting structure 110, thereby improving reliability and luminous efficacy of the light emitting device.

Figure 12A:
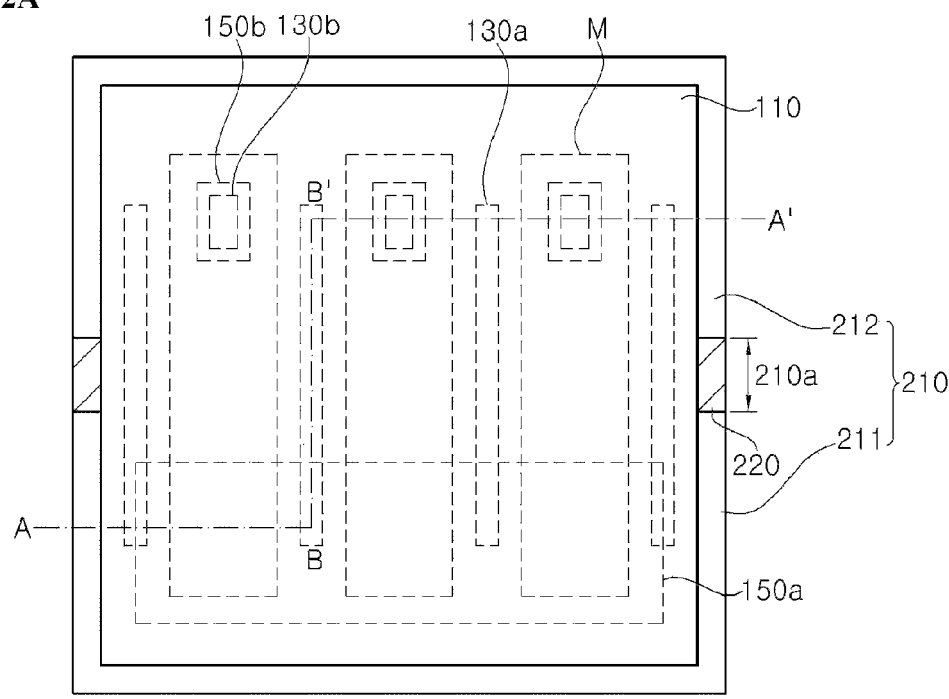
FIG. 12A is a plan view illustrating a light emitting device according to an exemplary embodiment and a method of fabricating the same.
Figure 12B:
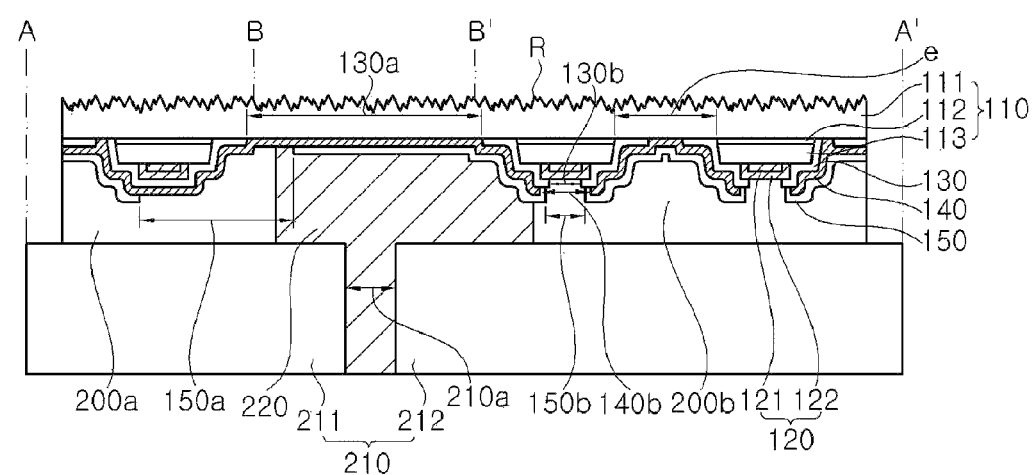
FIG. 12B is a cross-sectional view taken along sectional line A-B-B'-A' of FIG. 12A.

FIG. 12A is a plan view illustrating a light emitting device according to an exemplary embodiment and a method of fabricating the same. FIG. 12B is a cross-sectional view taken along sectional line A-B-B'-A' of FIG. 12A.

Referring to FIGS. 12A and 12B, the light emitting device according to this exemplary embodiment is different from the light emitting device of FIGS. 1A and 1B in that the first conductive type semiconductor layer 111 of the light emitting device according to this exemplary embodiment includes a rough surface R. With this structure, the light emitting device can reduce a ratio of light returning to the first conductive type semiconductor layer 111 through total reflection at an interface between the first conductive type semiconductor layer 111 and the exterior, thereby achieving improvement in reliability and luminous efficacy. The rough surface R may be formed by an etching process including at least one process selected from the group consisting of dry etching and wet etching. For example, the rough surface may be formed by wet etching using a solution containing at least one salt selected from the group consisting of KOH and NaOH, or may be formed by PEC etching. In another exemplary embodiment, the rough surface R may be formed by combination of dry etching and wet etching. It should be understood that the aforementioned methods for forming the rough surface R are provided for illustration only and the rough surface R may be formed on the first conductive type semiconductor layer 111 using a variety of methods known to those skilled in the art. Thereafter, although not shown in the drawings, a separate insulation layer may be formed on a side surface and the rough surface R of the light emitting device excluding the metal bulk 210 and the insulation portion 220 to protect the light emitting device from external impact while preventing current leakage.

Figure 13A:
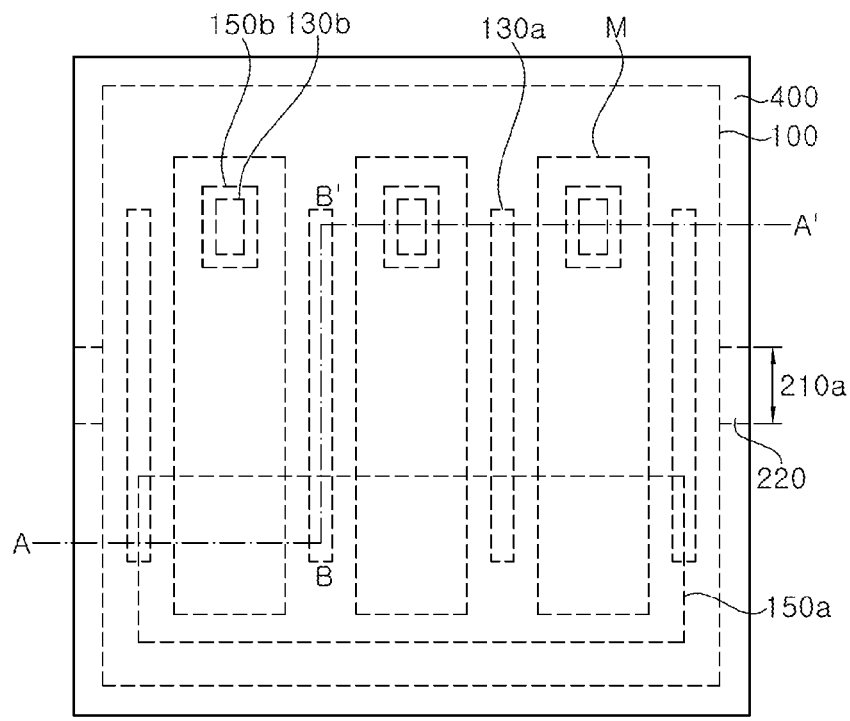
FIG. 13A is a plan view illustrating a light emitting device according to an exemplary embodiment and a method of fabricating the same.
Figure 13B:
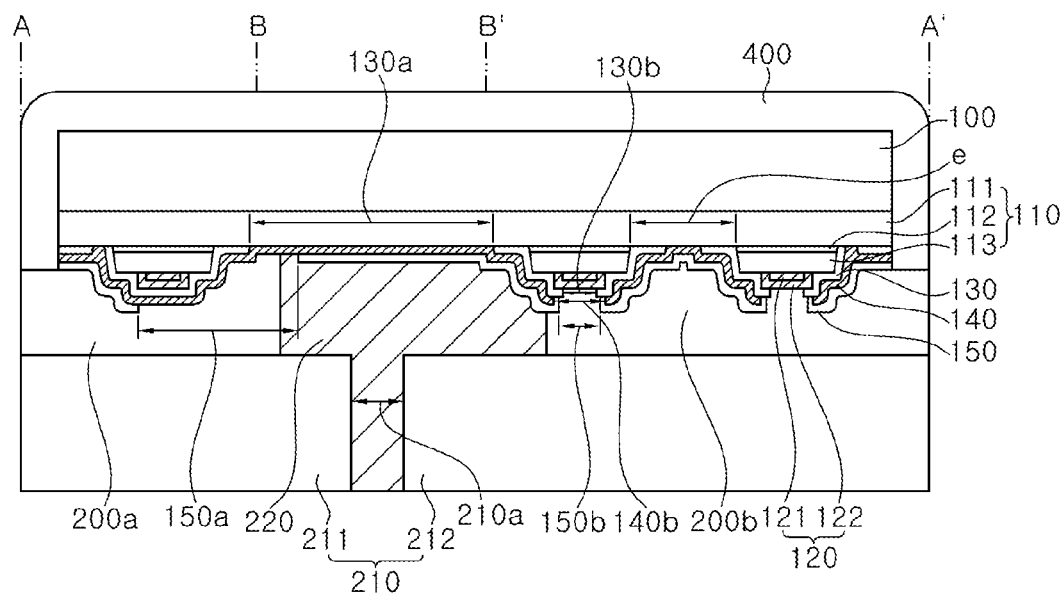
FIG. 13B is a cross-sectional view taken along sectional line A-B-B'-A' of FIG. 13A.

FIG. 13A is a plan view illustrating a light emitting device according to an exemplary embodiment and a method of fabricating the same. FIG. 13B is a cross-sectional view taken along sectional line A-B-B'-A' of FIG. 13A.

Referring to FIGS. 13A and 13B, the light emitting device according to this exemplary embodiment of the invention is different from the light emitting device of FIGS. 1A and 1B in that the light emitting device according to this exemplary embodiment further includes a wavelength conversion portion 400. As shown in FIGS. 13A and 13B, the wavelength conversion portion 400 may cover a light exit face of the growth substrate 100, a side surface of the first conductive type semiconductor layer 111, a side surface of the lower insulation layer 130, a side surface of the first electrode 140 and a side surface of the upper insulation layer 150, and may be placed on the solders 200a, 200b, without being limited thereto. Alternatively, for example, the wavelength conversion portion 400 may cover only the light exit face of the growth substrate 100 and the side surface of the first conductive type semiconductor layer 111. Such modification can be made by changing the etching depth described with reference to FIGS. 3A and 3B. The wavelength conversion portion 400 may include a phosphor layer containing phosphors and a resin, in which the phosphors are mixed with the resin to be randomly or evenly distributed in the resin. The wavelength conversion portion 400 can convert light emitted from the light emitting structure 110 into light having different wavelengths. As a result, it is possible to realize various colors, particularly white light, through combination of light emitted from the light emitting structure 110 and light emitted through the wavelength conversion portion 400.

The resin may include a polymer resin such as an epoxy resin or an acrylic resin, or a silicone resin, and may act as a matrix for dispersing the phosphors. The phosphors excite light emitted from a nitride-based semiconductor structure to convert the light into light having different wavelengths. The phosphors may include various phosphors well known to those skilled in the art, and may include at least one type of phosphor selected from among, for example, garnet phosphors, aluminate phosphors, sulfide phosphors, oxy-nitride phosphors, fluoride phosphors, nitride phosphors, and silicate phosphors. However, it should be understood that the present invention is not limited thereto. Although not shown in the drawings, the wavelength conversion portion 400 may include a plurality of phosphor layers. With this structure, the light emitting device can convert light emitted from the light emitting structure 110 into light having a wider variety of wavelengths. The wavelength conversion portion 400 may be formed by a method such as dispensing, spray coating, and the like.

Figure 14A:
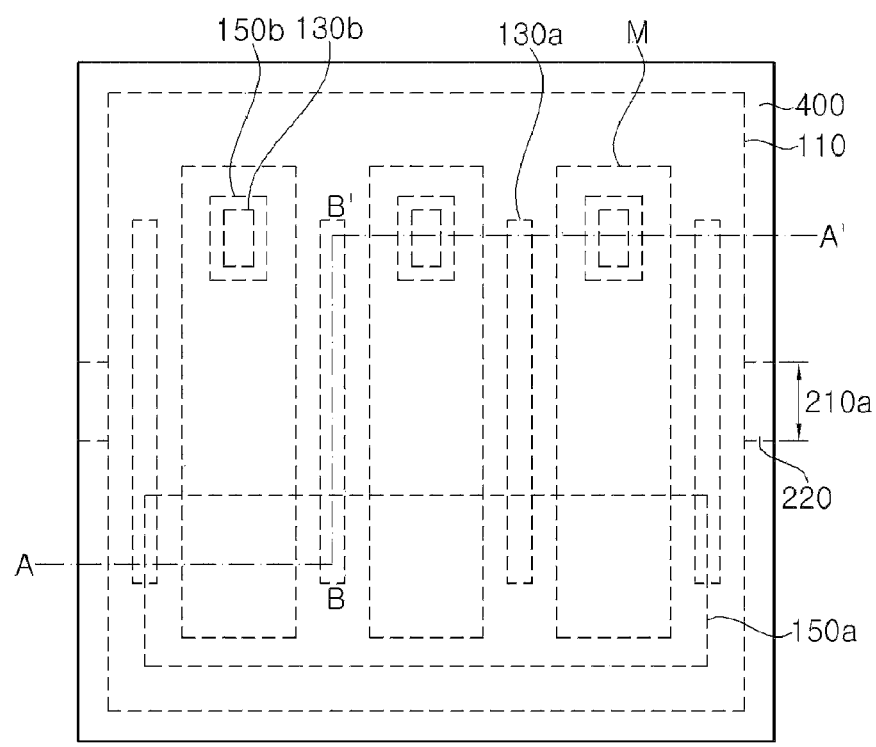
FIG. 14A is a plan view illustrating a light emitting device according to an exemplary embodiment and a method of fabricating the same.
Figure 14B:
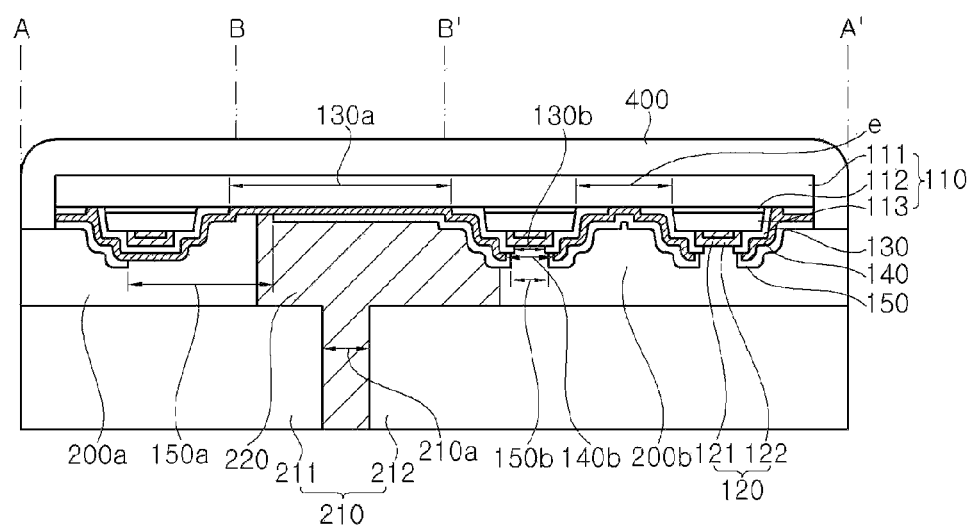
FIG. 14B is a cross-sectional view taken along sectional line A-B-B'-A' of FIG. 14A.

FIG. 14A is a plan view illustrating a light emitting device according to an exemplary embodiment and a method of fabricating the same. FIG. 14B is a cross-sectional view taken along sectional line A-B-B'-A' of FIG. 14A.

Referring to FIGS. 14A and 14B, the light emitting device according to this exemplary embodiment of the invention is different from the light emitting device of FIGS. 13A and 13B in that the growth substrate 100 is removed from the light emitting device according to this exemplary embodiment and the wavelength conversion portion 400 is formed on the first conductive type semiconductor layer 111 instead of being formed on the light exit face of the growth substrate 100. The method of fabricating the light emitting device of FIGS. 14A and 14B further includes forming a wavelength conversion portion 400 on the first conductive type semiconductor layer 111 in the method of fabricating the light emitting device described with reference to FIGS. 10A and 10B. In this exemplary embodiment, as the growth substrate 100 is removed, it is possible to solve problems such as absorption of light by the growth substrate 100, reduction in light intensity by the growth substrate 100, and the like, upon generation of light in the light emitting structure 110. In addition, it is possible to realize various colors, particularly, white light, through combination of light emitted from the light emitting structure 110 and light emitted through the wavelength conversion portion 400. Furthermore, the light emitting structure 110 can be protected by the wavelength conversion portion 400 without the growth substrate 100.

Figure 15A:
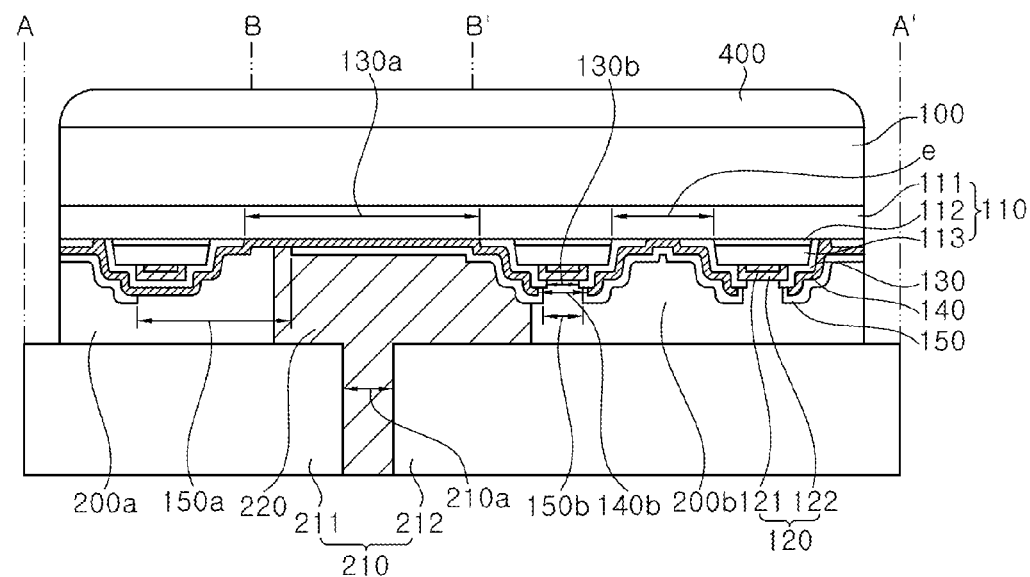
FIG. 15A and FIG. 15B are cross-sectional views illustrating a method of fabricating a light emitting device according to an exemplary embodiment.
Figure 15B:
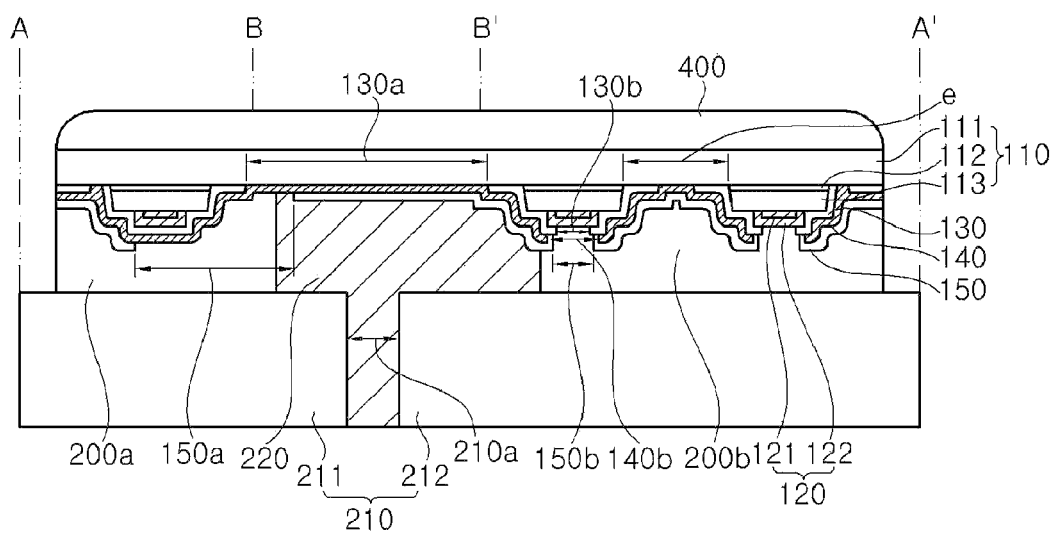

FIG. 15A and FIG. 15B are sectional views illustrating a method of fabricating a light emitting device according to an exemplary embodiment.

The light emitting device of FIG. 15A is different from the light emitting device of FIGS. 13A and 13B except that the wavelength conversion portion 400 covers a portion of the light exit face of the growth substrate excluding a side surface thereof. Referring to FIG. 15A, the wavelength conversion portion 400 resides on the growth substrate 100 and a side surface of the wavelength conversion portion 400 is generally parallel to the side surface of the growth substrate 100. Unlike the light emitting device of FIGS. 13A and 13B, since the solders 200a, 200b do not contact the wavelength conversion portion 400 in the light emitting device according to this exemplary embodiment, there is no need for the structure wherein side surfaces of the solders 200a, 200b protrude so as to support the wavelength conversion portion 400.

The light emitting device of FIG. 15B is different from the light emitting device of FIG. 15A in that the growth substrate 100 is omitted. In this exemplary embodiment, the wavelength conversion portion 400 is placed on the light emitting structure 110 and may contact the light emitting structure 110. As described in FIGS. 10A and 10B, the growth substrate 100 may be separated from the light emitting structure by various techniques for separation of substrates, such as laser lift-off, chemical lift-off, stress lift-off, and the like. Accordingly, the light emitting device of FIG. 15B is different from the light emitting device of FIGS. 14A and 14B in that the wavelength conversion portion 400 covers a portion of a light exit face of the first conductive type semiconductor layer 111 excluding the side surface thereof.

Figure 16A:
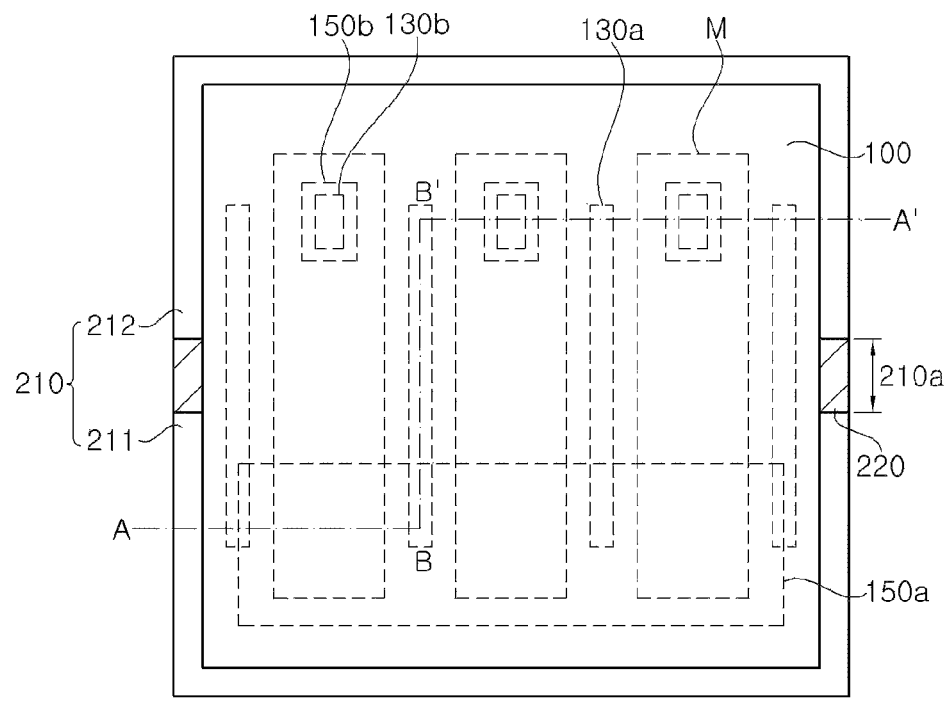
FIG. 16A is a plan view of a light emitting device according to an exemplary embodiment.
Figure 16B:
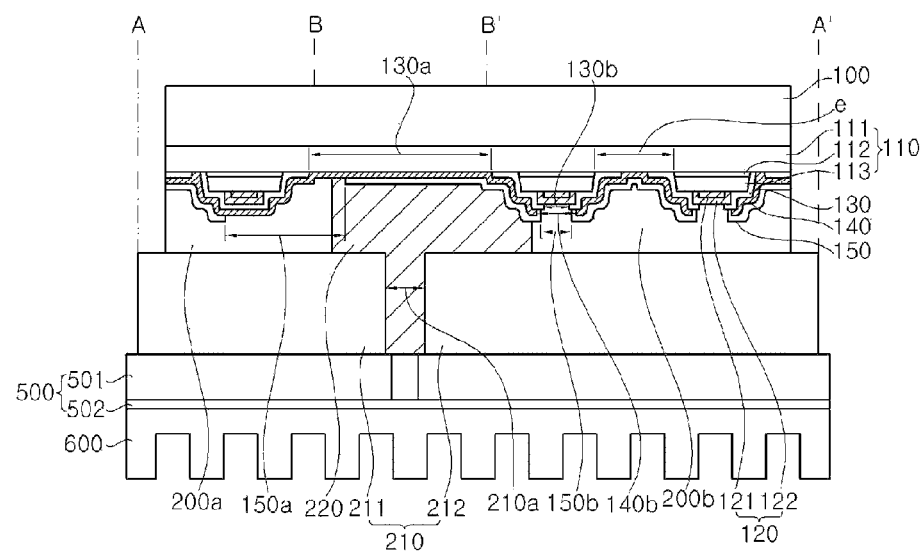
FIG. 16B is a cross-sectional view taken along sectional line A-B-B'-A' of FIG. 16A.

FIG. 16A is a plan view of a light emitting device according to an exemplary embodiment. FIG. 16B is a cross-sectional view taken along sectional line A-B-B'-A' of FIG. 16A Referring to FIGS. 16A and 16B, the light emitting device according to this exemplary embodiment of the invention is different from the light emitting device of FIGS. 1A and 1B in that the light emitting device according to this exemplary embodiment further includes a heat dissipation structure on the first and second metal bulks 211, 212. The heat dissipation structure may include a circuit substrate 500 and heat dissipation fins 600. The circuit substrate is placed on the metal bulk 210, and may include a conductive pattern 501 electrically connected to the first and second electrodes 140, 120 and an insulation plate 502 insulating the conductive pattern 501 from the heat dissipation fins 600. The conductive pattern 501 may include a metal having high thermal conductivity, for example, Cu and Au. The insulation plate 502 resides on the conductive pattern 501 and may include an insulation material such as a ceramic insulator. The heat dissipation fins 600 are formed on the insulation plate 502 and may include a material having high thermal conductivity. Thus, heat generated from the light emitting structure 110 can be easily dissipated by such plural protrusions to prevent the light emitting device from being damaged by heat, thereby improving reliability and luminous efficacy of the light emitting device.

The invention claimed is:
1. A light emitting device, comprising:
a light emitting structure comprising a first conductive type semiconductor layer, a second conductive type semiconductor layer disposed on the first conductive type semiconductor layer, and an active layer disposed between the first conductive type semiconductor layer and the second conductive type semiconductor layer;
a first electrode electrically connected to the first conductive type semiconductor layer;
a second electrode disposed on the second conductive type semiconductor layer and electrically connected to the second conductive type semiconductor layer;
a lower insulation layer covering an upper surface of the light emitting structure and an upper and side surfaces of the second electrode, the lower insulation layer being disposed between the light emitting structure and the first electrode and insulating the first electrode from the second electrode;
an upper insulation layer covering a portion of the first electrode;
a first metal bulk and a second metal bulk separated from each other, disposed on the upper insulation layer, and electrically connected to the first electrode and the second electrode, respectively; and
an insulation portion disposed between the first metal bulk and the second metal bulk, wherein a difference in coefficients of thermal expansion represented by Equation 1 is 20% or less, and wherein Equation 1 is as follows the difference in the coefficients of thermal expansion=[(a coefficient of thermal expansion of the first metal bulk or a coefficient of thermal expansion of the second metal bulk–a coefficient of thermal expansion of the light emitting structure)/the coefficient of thermal expansion of the first metal bulk or the second metal bulk]×100.  (Equation 1)

2. The light emitting device according to claim 1, wherein each of the first metal bulk and the second metal bulk comprises at least one material selected from the group consisting of Cu/Mo and Cu/W.

3. The light emitting device according to claim 1, wherein each of the first metal bulk and the second metal bulk has a thickness of 100 μm or more.

4. The light emitting device according to claim 1, wherein each of the first metal bulk and the second metal bulk has side surfaces protruding beyond a side surface of the light emitting structure.

5. The light emitting device according to claim 1, wherein the insulation portion comprises an epoxy molding compound.

6. The light emitting device according to claim 1, wherein the second electrode comprises a reflective metal layer and a barrier metal layer.

7. The light emitting device according to claim 1, wherein the second electrode comprises indium tin oxide (ITO) and the lower insulation layer comprises a distributed Bragg reflector (DBR).

8. The light emitting device according to claim 1, further comprising:
an electrode protection layer disposed on the second electrode.

9. The light emitting device according to claim 1, wherein the upper insulation layer covers the lower insulation layer adjoining the second electrode, and adjoins a portion of the second electrode.

10. The light emitting device according to claim 1, wherein the first conductive type semiconductor layer comprises a rough surface.

11. The light emitting device according to claim 1, further comprising:
a wavelength conversion portion disposed on the first conductive type semiconductor layer.

12. The light emitting device according to claim 11, wherein the wavelength conversion portion comprises a plurality of phosphor layers.

13. The light emitting device according to claim 1, further comprising:
a first pad disposed between the first electrode and the first metal bulk; and
a second pad disposed between the second electrode and the second metal bulk.

14. The light emitting device according to claim 1, further comprising:
a heat dissipation structure disposed on the first metal bulk and the second metal bulk.

15. The light emitting device according to claim 1, further comprising:
one or more holes penetrating the second conductive type semiconductor layer and the active layer and exposing the first conductive type semiconductor layer, the first conductive type semiconductor layer being electrically connected to the first electrode through the holes.

16. The light emitting device according to claim 1, wherein the light emitting structure comprises:
at least one mesa comprising the active layer and the second conductive type semiconductor layer; and
an exposing region formed adjacent to a side surface of the mesa and exposing the first conductive type semiconductor layer, the first conductive type semiconductor layer being electrically connected to the first electrode through the exposing region.

17. The light emitting device according to claim 16, wherein the exposing region comprises a plurality of holes separated from each other.

18. The light emitting device according to claim 16, wherein the exposing region surrounds the mesa.

* * * * *

UNITED STATES PATENT AND TRADEMARK OFFICE
CERTIFICATE OF CORRECTION

PATENT NO. : 10,003,039 B2
APPLICATION NO. : 15/513150
DATED : June 19, 2018
INVENTOR(S) : Jong Min Jang, Jong Hyeon Chae and Dae Woong Suh Page 1 of 1

It is certified that error appears in the above-identified patent and that said Letters Patent is hereby corrected as shown below:

On the Title Page

Item (72) Inventors: change the address of the Third Inventor from:
"Dae Woong Suh, Ansan-si (DE)"
To:
"Dae Woong Suh, Ansan-si (KR)".

Signed and Sealed this
Twenty-fourth Day of December, 2019

Andrei Iancu
*Director of the United States Patent and Trademark Office*